United States Patent
Tamegaya

(10) Patent No.: US 6,295,630 B1
(45) Date of Patent: Sep. 25, 2001

(54) METHOD AND APPARATUS FOR MEASURING AN OVERLAP LENGTH OF MISFET, AND A RECORDING MEDIUM AND A DEVICE MODEL EACH CARRYING AN EXTRACTION PROGRAM FOR DETERMINING THE OVERLAP LENGTH

(75) Inventor: Yukio Tamegaya, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/362,101

(22) Filed: Jul. 28, 1999

(30) Foreign Application Priority Data

Jul. 28, 1998 (JP) .................................................. 10-213335

(51) Int. Cl.[7] ...................................................... G06F 11/50
(52) U.S. Cl. ...................................................... 716/4; 716/5
(58) Field of Search ................................................ 716/4, 5

(56) References Cited

U.S. PATENT DOCUMENTS 6,195,790 * 2/2001 Tanimoto et al. ........................ 716/4

FOREIGN PATENT DOCUMENTS 54-2667   1/1979 (JP).
7-176740  7/1995 (JP).

* cited by examiner

Primary Examiner—Trong Phan
(74) Attorney, Agent, or Firm—Young & Thompson

(57) ABSTRACT

An overlap length, which is one of important device parameters and is necessary for a circuit simulation of a MOSFET, is precisely determined based on the result of measurement in which: a between gate/substrate capacitance not including a fringe capacitance and an overlap capacitance is measured at each of gate voltages to obtain the above result. An apparatus for measuring the overlap length is constructed of: an electric measuring instrument for measuring a group of measured devices to facilitate calculation of the capacitance; an input unit; a recording medium carrying a processing program; a data processing unit; a storage unit; and, an output unit.

18 Claims, 12 Drawing Sheets

(1) extraction of R measurement under application of DC bias voltage only $$R = \frac{E}{I}$$

(2) extraction of $C_{GB}$ measurement under application of AC voltage and DC bias voltage $$i_R = \frac{e}{R} \quad , i_C = j\omega C e$$
$$i_o{}^2 = i_R{}^2 + i_C{}^2$$
$$C_{GB} = \frac{i_C}{\omega e} = \frac{\sqrt{i_o{}^2 - i_R{}^2}}{\omega e}$$

$I_d$ ; drain current
$r_0$ ; diffusion layer resistance
$V_g$ ; gate voltage (between gate/source voltage)
$V_d$ ; drain voltage (between drain/source voltage)

$L$ ; gate length
$\Delta L$ ; overlap length
$L_{eff}$ ; effective gate length ($= L - \Delta L$)
$n^+$ ; n-type high concentration diffusion layer

*FIG.13A(PRIOR ART)*  86;impurities such as As⁺, etc.
81 gate electrode
85;gate oxide film
n⁺  n⁺
p-type silicon substrate
84

82  81  85;gate oxide film
gate electrode
source n⁺   n⁺  drain  83
p-type silicon substrate
84

METHOD AND APPARATUS FOR MEASURING AN OVERLAP LENGTH OF MISFET, AND A RECORDING MEDIUM AND A DEVICE MODEL EACH CARRYING AN EXTRACTION PROGRAM FOR DETERMINING THE OVERLAP LENGTH

BACKGROUND OF THE INVENTION

1. Field of the Invention

The present invention relates to: a method and an apparatus each capable of precisely measuring a so-called overlap length of a MISFET (i.e., Metal Insulator Semiconductor Field Effect Transistor), wherein the overlap length forms one of important physical device parameters required in carrying out a circuit simulation of the MISFET such as MOS (i.e., Metal Oxide Semiconductor) transistors and the like; and, further to a recording medium and a device model each carrying an extraction program for determining the overlap length.

2. Description of the Related Art

In the technical field of LSI memories, it takes much time and money to develop a real-world prototype circuit for a new MOS memory, or for realizing a change in a fabrication process such as diffusion processes and like processes of a conventional MOS memory each time such new MOS memory is designed and developed, or such change in the production process is carried out. Consequently, heretofore, in place of such building of the real-world prototype circuit of the new MOS memory in design and development, it has been performed a series of computer simulations in design and development of the new MOS memory.

Such series of the computer simulations comprise: a process simulation for extracting various process data such as impurity concentrations and like process data; a device simulation for extracting various device parameters such as an effective channel length (Leff) and the like on the basis of the process data obtained through the above process simulation; and, a circuit simulation in which an exact value of a drain current (Id) is determined on the basis of the device parametrers obtained through the above device simulation, and a circuit analysis program called "SPICE" (i.e., Simulation Program with Integrated Circuit Emphasis) works so that memory operations, flip flop operations and like operations are investigated.

The more the results of these simulations approarch the results of experiments, the less period of time a desired MOS memory requires in its development. Consequently, demand for precise simulation techniques is very high.

Now, this type of computer simulation will be described in detail.

When a circuit simulation is performed in memory operation or in flip flop operation with respect to a MOS memory newly designed or changed in its fabrication process, it is necessary to precisely extract the device parameters by previously conducting both the above-mentioned process simulations and the device simulations in order that the device model having been incorporated in the circuit simulation may reproduce the actual device characteristics. A conventional method for extracting the device parameters will be now described. FIG. 10 shows a circuit diagram equivalent to the arrangement of a MOS transistor. A device model of such a MOS ransistor is represented by the following equation (1) in which drain current (Id) is defined.

$$Id = f(p1, p2, \ldots, pN, Vd, Vg, Vb) \quad (1)$$

where (p1, p2, . . . , pN) is a set of the device parameters; Vd is a drain voltage; Vg is a gate voltage; and, Vb is a substrate voltage.

In general, the device parameters have physical quantities, for example such as: an effective channel length (Leff), gate length (L), channel width (W), threshold voltage (Vth), resistance ($r_0$) of a diffusion layer (shown in FIG. 10); an effective mobility ($\mu e$) of movable carriers depending on the gate voltage (Vg); and, the like. Of these parameters, the device dimensions such as the gate length (L), channel width (W) and like dimensions capable of being directly measured are previously determined, and, therefore previously removed from a group of unknown parameters being extracted. On the other hand, assuming that the characteristics of the actually measured device are represented by the following equation (2), extraction of general device parameters is defined as follows: namely, over the entire range of applied voltages which the equation (2) directs, device parameters (p1, p2, . . . , pN) are selected in a manner such that the characteristics of the device model coincide with those of the actually measured device.

$$Id = g(Vd, Vg, Vb) \quad (2)$$

More specifically, when the values of the above two equations (1) and (2) each at the i-th one of M pieces of applied voltages used in measurement are defined to be fi and gi, respectively, the above device parameters (p1, p2, . . . , pN) are selected so as to make the squared error $E = \Sigma(fi - gi)^2$ minimum. In this derivation, generally a so-called "method of iteration" is used with the use of the above-mentioned "SPICE". In this "method of iteration": at first, trial initial values of the device parameters (p1, p2, . . . , pN) are provided; and, thereafter, these device parameters (p1, p2, . . . , pN) starting therefrom are repeatedly rewritten until their variations assume very small values.

However, when this "method of iteration" is merely applied to the device parameters (p1, p2, . . . , pN), the thus extracted values tend to become abnormal from a physical point of view in spite of their inherent physical quantities. This is because: irrespective of the fact that the device model represented by the equation (1) does not completely coincide with the actual device in characteristics, a large number of the device parameters are forcibly determined on the basis of delicate differences between the equation (1) and the measured values.

When the device model is defined by the device parameters which are nonsense from a physical point of view, the characteristics of the device model when these device parameters are varied differ from those of the actual device. Particularly, with respect to the dependency of the characteristics on the gate length, the device model differs from the actual device, which poses a serious problem. In other words, as for the device parameters extracted from the device having the gate length L1, when the device has its gate length L1 replaced with another value L2, the characteristics of this device differ from those of an actual device having the gate length L2.

In order to cover the above deficiency, as for the device parameters which are important from a physical point of view, it is often performed to separately determine these important device parameters before the "method of iteration" is applied to the device parameters. As one of these importance device parameters, it is possible to enumerate the overlap length ($\Delta L$). Here, definition of the overlap length ($\Delta L$) is made as shown in FIG. 11. More specifically, through the overlap length ($\Delta L$) a gate electrode 81 overlaps both a source diffusion layer 82 and a drain diffusion layer 83.

Incidentally, as shown in FIG. 11, the effective channel length (Leff) is equal to a distance between a source-side p-n junction and a drain-side p-n junction located in the surface of a silicon substrate 84. In other words, the effective channel length (Leff) is equal to a difference between the gate length (L) and the overlap length (ΔL). Consequently, when the overlap length (ΔL) is determined, it is possible to determine the effective channel length (Leff=L−ΔL).

Heretofore, for example, as disclosed in Japanese Patent Laid-Open Nos. Sho54-2667 and Hei07-176740, derivation of the overlap length (ΔL) has been made by measuring a channel resistance (i.e., a resistance between a source electrode and a drain electrode) R represented by the following equation (4) at each of various effective gate voltages Vge represented by the following equation (3) in each of a plurality of MOS transistors varying in gate length when a drain voltage Vd is very small:

$$Vge=Vg-Vth \quad (3)$$

where Vg is a gate voltage (i.e., a between gate/source voltage); and, Vth is a threshold voltage (i.e., a critical value of the gate voltage between an ON and an OFF mode of the MOS transistor).

$$R=(\Delta Id/\Delta Vd)^{-1} \quad (4)$$

where Vd is a drain voltage (i.e., a between drain/source voltage).

FIG. 12 shows a characteristic diagram of the MOSFET, illustrating the conventional method of derivation of the overlap length (ΔL) of the MOSFET, more specifically, illustrating the dependency of the channel resistance (R) on the gate length (L) in the MOSFET at each of the effective gate voltages (ranging from Vge1 to Vge5), wherein: the channel width is equal to 10 μm; and, a film thickness of the gate oxide film Tox is equal to 10 μm in an n-type MOS transistor. In the characteristic diagram of the MOSFET shown in FIG. 12: each of plots shows each of measurement locations; and, a group of straight lines are a group of regression lines each calculated by interpolation through the so-called "the method of least squares" in a condition in which the effective gate voltages ranging of from Vge1 to Vge5 corresponding to a range of from 1.0 volt to 3.0 volts, respectively.

In an n-type MOS transistor shown in FIG. 11, when a positive voltage (Vge1) is applied to a gate electrode 81, minority carriers (i.e., electrons) are attracted from the p-region to the surface of this p-region (i.e., p-type silicon substrate) 84 underneath a gate oxide film 85. The higher the gate voltage increases (i.e., Vge1<Vge2<Vge3<Vge4<Vge5), the more the electrons are attracted to the surface of the silicon substrate 84. Consequently, as shown in FIG. 12, the channel resistance R decreases, and, eventually an n-type narrow region (i.e., n-type channel) is formed underneath the surface of the gate oxide film 85. On the other hand, as shown in FIG. 12, a plurality of regression lines corresponding to the effective gate voltages of from Vge1 to Vge5 substantially converge on a single point (a, b).

The reason why the group of the regression lines converge on such a single point (a, b) is as follows: namely, In the fabrication process of the n-type MOS transistor, as shown in FIGS. 13A and 13B, first of all, a gate electrode 81 made of polysilicon and the like is formed on the surface of p-type silicon substrate 84 through a gate oxide film 85. Then, by self-alignment of the thus formed gate electrode 81, an impurity 86 such as "As$^+$" and like impurities is ion-implanted into the surface of the p-type silicon substrate 84, as shown in FIG. 13A. In order to activate the impurity 86 thus ion-implanted, a thermal annealing process is conducted as shown in FIG. 13B. As a result, a source diffusion region 82 and a drain diffusion region 83 are formed in opposite sides of the gate oxide film 85, wherein each of the source and the drain diffusion regions 82, 83 is constructed of an n-type high concentration diffusion layer. In the above ion-implantation stage, as shown in FIG. 13A, though the impurity 86 does not enters a region underneath the gate oxide film 85, during the subsequent thermal annealing stage, the impurity 86 having been ion-implanted diffuses into the region underneath the gate oxide film 85, as shown in FIG. 13B. Due to this, the gate oxide film 85 partially overlaps both the source diffusion region 82 and the drain diffusion region 83; since the degree of such diffusion of the impurity 86 into the region underneath the gate oxide film 85 does not vary in a condition in which the concentration of the impurity thus ion-implanted and the annealing conditions are the same, the overlap length (ΔL) does not vary irrespective of the gate length (L) as long as the formation conditions of the n-type high concentration diffusion layers are the same. Incidentally, this is true as to a p-type MOS transistor.

Consequently, when the gate length (L) is gradually decreased, the source diffusion region 82 is eventually brought into contact with the drain diffusion region 83 to cause, without fail, a phenomenon in which the effective channel length (Leff) becomes a value of zero, irrespective of the fact that the gate 81 is still remains. When the above phenomenon occurs, the channel resistance (R) becomes the sum of a resistance $r_0/2$ of the drain diffusion layer 83 not depending on the gate length (L) and a resistance $r_0/2$ of the source diffusion layer 82 not depending on the gate length (L). Consequently, as shown in FIG. 12, the group of the regression lines corresponding to the Vge1 to the Vge5 converge on the single point the coordinate of which is represented by "(a, b)". The x-axis coordinate (i.e., "a") of the above convergent point (a, b) corresponds to the overlap length (ΔL). On the other hand, the y-axis (b) of the convergent point (a, b) corresponds to the resistance $r_0$ of the diffusion layer.

The problems to be solved by the present invention is as follows: namely, in recent years, the MOS memory tends to assume a finer- and higher-density geometry. Due to this, the MOS transistors used in such ,MOS memory tends to have its gate length (L) more shortened.

However, in the conventional derivation operation of the overlap length (ΔL), when the gate length (L) decreases, the dependency of the channel resistance (R) on the gate length (L) loses its linearity, which makes it difficult for the group of the regression lines to converge on a single point. Due to this, it is difficult for the conventional derivation operation to determine an exact value of the overlap length (ΔL). This is because: when the gate length (L) decreases, the "two dimensional effect" (i.e., two dimensional distribution of electric current density) which is one of the "short channel effect" becomes distinct, and, therefore not negligible.

SUMMARY OF THE INVENTION

It is an object of the present invention to provide: a method and an apparatus each capable of precisely measuring a so-called overlap length of an MISFET (i.e., Metal Insulator Semiconductor Field Effect Transistor), wherein the overlap length forms one of important physical device parameters required in carrying out a circuit simulation of the MISFET such as MOS (i.e., Metal Oxide Semiconductor) transistors and the like; and, further a recording medium and a device model each carrying an extraction program for determining the overlap length.

According to a first aspect of the present invention, there is provided a method for measuring an overlap length of each of a plurality of MISFETs varying in gate length (L), each of the MISFETs being formed in a surface region or in a well of the surface region of a semiconductor substrate, comprising the steps of:

applying a predetermined voltage to a gate of each of the MISFETs to keep each of the MISFETs turned OFF;

measuring a between gate/semiconductor substrate capacitance ($C_{GB}$) or a between gate/well capacitance ($C_{GB}$) in each of the gate lengths (L) of the MISFETs to obtain a capacitance measurement result;

finding out the dependency of the capacitance ($C_{GB}$) on each of the gate lengths (L) in each of the MISFETs on the basis of the capacitance measurement result; and determining an overlap length ($\Delta L$) on the basis of the dependency of the capacitance ($C_{GB}$) on each of the gate lengths (L), the gate overlapping both a source and the drain through the overlap length ($\Delta L$) in each of the MISFETs.

In the foregoing, a preferable mode is one wherein:

in a condition in which the semiconductor substrate or the well of each of the MISFETs is kept substantially at the same potential level as that of each of the source and the drain, or grounded together with the source and the drain, a predetermined DC or AC voltage is applied to a region between the gate and the semiconductor substrate or to a region between the gate and the well;

at least, by the use of a current measuring means, a current flowing through the region between the gate and the semiconductor substrate, or through the region between the gate and the well is measured to obtain a current measurement result; and on the basis of the current measurement result, the capacitance ($C_{GB}$) between the gate and the semiconductor substrate, or, between the gate and the well is calculated on each of the gate lengths (L).

Also, a preferable mode is one wherein:

a voltage supply for applying a DC or an AC bias voltage to the gate is connected with the gate;

the current measuring means has one of its terminals connected with the semiconductor substrate or with the well;

a voltage measuring means has one of its terminals connected with the gate and the other of its terminals connected with the semiconductor substrate or with the well; and in a condition in which the other terminal of the current measuring means is set substantially at the same potential level as that of both the source and the drain, or, grounded together with the source and the drain, a voltage value between the gate and the semiconductor substrate or between the gate and the well is measured by the voltage measuring means;

by the use of the current measuring means, a value of current flowing between the gate and the semiconductor substrate or between the gate and the well is measured to obtain a voltage measurement result;

on the basis of the voltage measurement result, the capacitance ($C_{GB}$) between the gate and the semiconductor substrate, or, between the gate and the well is calculated on each of the gate lengths (L).

Also, a preferable mode is one wherein:

in a condition in which each of the MISFETs is held in its OFF mode, a predetermined value of DC bias voltage is applied to the gate, so that a resistance ($R_{GB}$) of an equivalent circuit disposed between the gate and the semiconductor substrate, or, between the gate and the well is determined;

also in the condition in which each of the MISFETs is held in its OFF mode, the predetermined value of DC bias voltage is applied to the gate together with an AC voltage having a predetermined frequency, so that an AC current flowing between the gate and the semiconductor substrate, or, between the gate and the well is determined;

on the basis of both the Ac current thus determined and the resistance ($R_{GB}$), the capacitance ($C_{GB}$) between the gate and the semiconductor substrate, or, between the gate and the well is calculated.

Also, a preferable mode is one wherein:

in a condition in which each of the MISFETs is held in its OFF mode, a predetermined value of DC bias voltage is applied to the gate together with an AC voltage having a predetermined frequency, so that both an effective value of an AC current flowing between the gate and the semiconductor substrate, or, between the gate and the well is determined together with a difference in phase between the AC current and an AC voltage appearing between the gate and the semiconductor substrate, or, between the gate and the well;

on the basis of both the effective value and the difference in phase thus determined, the capacitance ($C_{GB}$) between the gate and the semiconductor substrate, or, between the gate and the well is calculated.

Also, a preferable mode is one wherein:

a process of extrapolation is applied to the dependency of the capacitance ($C_{GB}$) on each of the gate lengths (L), so that a predetermined value ($L_0$) of the gate lengths (L) is determined; and the predetermined value ($L_0$) of the gate lengths (L) is judged to be the overlap length ($\Delta L$).

Also, a preferable mode is one wherein:

the capacitance ($C_{GB}$) between the gate and the semiconductor substrate, or, between the gate and the well on each of the gate lengths (L) is measured to derive a regression line defined by a predetermined equation ($C_{GB}=aL+b$) through which the capacitance ($C_{GB}$) is represented by a function of the gate lengths (L); and on the basis of the regression line thus derived, the predetermined value ($L_0$) of the gate lengths (L) is determined when the capacitance ($C_{GB}$) becomes a value of zero.

In the addition, a preferable mode is one wherein:

a plurality of DC bias voltages varying in value are sequentially applied to the gate of each of the MISFETs in a condition in which the AC voltage having the predetermined frequency is also applied to the gate, so that the capacitance ($C_{GB}$) between the gate and the semiconductor substrate, or, between the gate and the well on each of the gate lengths (L) is measured to obtain a capacitance measurement result;

on the basis of the capacitance measurement result, the dependency of the capacitance ($C_{GB}$) on each of the gate lengths (L) at each of the DC bias voltages applied to the gate is determined;

a process of extrapolation is applied to the dependency of the capacitance ($C_{GB}$) on each of the gate lengths (L) at each of the DC bias voltages, so that various values ($L_{01}, L_{02}, \ldots, L_{0n}$) of the gate lengths (L) are determined at each of the DC bias voltages; and the saturated or the largest one of the values ($L_{o1}, L_{o2}, \ldots, L_{on}$) of the gate lengths (L) thus determined is judged to be the overlap length ($\Delta L$).

Also, a preferable mode is one wherein:

a plurality of DC bias voltages varying in value are sequentially applied to the gate of each of the MISFETs in a condition in which the AC voltage having the predetermined frequency is also applied to the gate, so that the capacitance ($C_{GB}$) between the gate and the semiconductor substrate, or, between the gate and the well on each of the gate lengths (L) is measured to obtain a capacitance measurement result;

on the basis of the capacitance measurement result, a regression line defined by a predetermined equation ($C_{GB}$= aL+b) through which the capacitance ($C_{GB}$) is represented by a function of the gate lengths (L) is derived;

on the basis of the regression line thus derived on each of the DC bias voltages, a plurality of values ($L_{o1}, L_{o2}, \ldots, L_{on}$) of the gate lengths (L) are determined at each of the DC bias voltages when the capacitance ($C_{GB}$) becomes a value of zero; and the saturated or the largest one of the values ($L_{o1}, L_{o2}, \ldots, L_{on}$) of the gate lengths (L) thus determined is judged to be the overlap length ($\Delta L$).

Also, a preferable mode is one wherein:

the voltage at which each of the MISFETs is held in its OFF mode is a value less than or in the vicinity of a threshold voltage at which a channel is formed in the semiconductor substrate or in the well each underneath the gate, whereby each of the MISFETs changes its mode from the OFF mode to its ON mode.

Also, a preferable mode is one wherein:

the voltage at which each of the MISFETs is held in its OFF mode is a value less than or in the vicinity of a threshold voltage at which a channel is formed in the semiconductor substrate or in the well each underneath the gate, whereby each of the MISFETs changes its mode from the OFF mode to its ON mode.

According to a second aspect of the present invention, there is provided a device model of a MISFET defined by an equation representing a drain current flowing between a source and a drain of the MISFET when a DC bias voltage is applied to a gate of the MISFET, the drain current being represented by a function of parameters comprising:

a threshold value of the DC bias voltage, i.e., threshold voltage;

a resistance between the gate and a source of the MISFET;

an effective mobility of carriers depending on the gate voltage; and an effective channel length (Leff), wherein the effective channel length (Leff) is determined by subtracting an overlap length ($\Delta L$) from a gate length (L); and, the gate length (L) is determined by the use of a method for measuring the overlap length ($\Delta L$) of each of aplurality of the MISFETs varying in gate length (L), each of the MISFETs being formed in a surface region or in a well of the surface region of a semiconductor substrate, comprising the steps of:

applying a predetermined voltage to the gate of each of the MISFETs to keep each of the MISFETs turned OFF;

measuring a between gate/semiconductor substrate or a between gate/well capacitance ($C_{GB}$) in each of the gate lengths (L) of the MISFETs to obtain a capacitance measurement result;

finding out the dependency of the capacitance (CGB) on each of the gate lengths (L) in each of the MISFETs on the basis of the capacitance measurement result; and determining an overlap length ($\Delta L$) on the basis of the dependency of the capacitance ($C_{GB}$) on each of the gate lengths (L), the gate overlapping both a source and the drain through the overlap length ($\Delta L$) in each of the MISFETs, wherein the overlap length ($\Delta L$) is determined by the method described in any one of the first to the tenth aspects of the present invention.

According to a third aspect, there is provided an apparatus for measuring an overlap length of each of a plurality of MISFETs varying in gate length, each of the MISFETs being formed in a surface region or in a well of the surface region of a semiconductor substrate of each of the MISFETs, wherein a plurality of DC bias voltages varying in value are sequentially applied to a gate of each of the MISFETs in a condition in which an AC voltage having a predetermined frequency is also applied to the gate, the apparatus comprising:

a capacitance input means for issuing a capacitance ($C_{GB}$) to a dependency-on-gate length derivation means, the capacitance ($C_{GB}$) being measured between the gate and the semiconductor substrate, or, between the gate and the well on each of the gate lengths (L) at each of a plurality of DC bias voltages;

the dependency-on-gate length derivation means which, on the basis of the capacitance ($C_{GB}$) issued from the capacitance input means, determines the dependency of the capacitance ($C_{GB}$) on the gate lengths (L); and an overlap length judging means for judging the saturated or the largest one of a plurality of values ($L_{o1}, L_{o2}, \ldots, L_{on}$) of the gate lengths (L) to be an overlap length ($\Delta L$), the values ($L_{o1}, L_{o2}, \ldots, L_{on}$) of the gate lengths (L) being determined by applying a process of extrapolation to the dependency of the capacitance ($C_{GB}$) on the gate lengths (L) at each of the DC bias voltages when the capacitance ($C_{GB}$) becomes a value of zero.

According to a fourth aspect of the present invention, there is provided an apparatus for measuring an overlap length of each of a plurality of MISFETs varying in gate length, each of the MISFETs being formed in a surface region or in a well of the surface region of a semiconductor substrate of each of the MISFETs, wherein a plurality of DC bias voltages varying in value are sequentially applied to a gate of each of the MISFETs in a condition in which an AC voltage having a predetermined frequency is also applied to the gate, the apparatus comprising:

a capacitance input means for issuing a capacitance ($C_{GB}$) to a regression-line derivation means, the capacitance ($C_{GB}$) being measured between the gate and the semiconductor substrate, or, between the gate and the well on each of the gate lengths (L) at each of a plurality of DC bias voltages;

the regression-line derivation means which, on the basis of the capacitance ($C_{GB}$) issued from the capacitance input means, determines a regression line defined by a predetermined equation ($C_{GB}$=aL+b) through which the capacitance ($C_{GB}$) is represented by a function of the gate lengths (L), the regression line being determined at each of the DC bias voltages; and an overlap length judging means for judging the saturated or the largest one of a plurality of values ($L_{o1}, L_{o2}, \ldots, L_{on}$) of the gate lengths (L) to be an overlap length ($\Delta L$), the values ($L_{o1}, L_{o2}, \ldots, L_{on}$) of the gate lengths (L) being determined at each of the DC bias voltages when the capacitance ($C_{GB}$) becomes a value of zero, on the basis of the regression line determined in the regression-line derivation means.

According to a fifth aspect of the present invention, there is provide an apparatus for measuring an overlap length of each of a plurality of MISFETs varying in gate length, each of the MISFETs being formed in a surface region or in a well of the surface region of a semiconductor substrate of each of the MISFETS, wherein a plurality of DC bias voltages varying in value are sequentially applied to a gate of each of the MISFETs in a condition in which an AC voltage having a predetermined frequency is also applied to the gate, the apparatus comprising:

a capacitance measuring means for measuring a capacitance ($C_{GB}$) between the gate and the semiconductor substrate, or, between the gate and the well on each of the gate lengths (L) when both the DC bias and the AC voltage are applied to the gate, the capacitance measuring means being provided with both an AC and a DC voltage supply to issue a measurement result;

a dependency-on-gate length derivation means which, on the basis of the measurement result issued from the capacitance measuring means, determines the dependency of the capacitance ($C_{GB}$) on the gate lengths (L) at each of the DC bias voltages; and an overlap length judging means for judging the saturated or the largest one of a plurality of values ($L_{01}, L_{02}, \ldots, L_{0n}$) of the gate lengths (L) to be an overlap length ($\Delta L$), the values ($L_{01}, L_{02}, \ldots, L_{0n}$) of the gate lengths (L) being determined by applying a process of extrapolation to the dependency of the capacitance ($C_{GB}$) on the gate lengths (L) at each of the DC bias voltages when the capacitance ($C_{GB}$) becomes a value of zero.

According to a sixth aspect of the present invention, there is provided an apparatus for measuring an overlap length of each of a plurality of MISFETs varying in gate length, each of the MISFETs being formed in a surface region or in a well of the surface region of a semiconductor substrate of each of the MISFETs, wherein a plurality of DC bias voltages varying in value are sequentially applied to a gate of each of the MISFETs in a condition in which an AC voltage having a predetermined frequency is also applied to the gate, the apparatus comprising:

a capacitance measuring means for measuring a capacitance ($C_{GB}$) between the gate and the semiconductor substrate, or, between the gate and the well on each of the gate lengths (L) when both the DC bias and the AC voltage are applied to the gate, the capacitance measuring means being provided with both an AC and a DC voltage supply to issue a measurement result;

a regression-line derivation means which, on the basis of the measurement result issued from the capacitance measuring means, determines a regression line defined by a predetermined equation ($C_{GB}=aL+b$) through which the capacitance ($C_{GB}$) is represented by a function of the gate lengths (L), the regression line being determined at each of the DC bias voltages; and an overlap length judging means for judging the saturated or the largest one of a plurality of values ($L_{01}, L_{02}, \ldots, L_{0n}$) of the gate lengths (L) to be an overlap length ($\Delta L$), the values ($L_{01}, L_{02}, \ldots, L_{0n}$) of the gate lengths (L) being determined at each of the DC bias voltages when the capacitance ($C_{GB}$) becomes a value of zero, on the basis of the regression line determined in the regression-line derivation means.

According to a seventh aspect of the present invention, there is provided a recording medium accessible through a computer, wherein each of a plurality of MISFETs varying in gate length (L) is formed in a surface region or in a well of the surface region of a semiconductor substrate of each of the MISFETs, wherein a plurality of DC bias voltages varying in value are sequentially applied to a gate of each of the MISFETs in a condition in which an AC voltage having a predetermined frequency is also applied to the gate, the recording medium storing therein an overlap-length calculating program for calcurating an overlap length of each of the MISFETs, the program being executed by the computer and comprising the steps of:

determining the dependency of a capacitance ($C_{GB}$) on each of the gate lengths (L) at each of the DC bias voltages on the basis of the capacitance ($C_{GB}$) which is supplied from a data input means, the capacitance ($C_{GB}$) appearing between the gate and the semiconductor substrate, or, between the gate and the well on each of the gate lengths (L) at each of a plurality of DC bias voltages;

calculating each of a plurality of values ($L_{01}, L_{02}, \ldots, L_{0n}$) of the gate lengths (L) by applying a process of extrapolation to the dependency of the capacitance ($C_{GB}$) on the gate lengths (L) at each of the DC bias voltages when the capacitance ($C_{GB}$) becomes a value of zero; and judging the saturated or the largest one of the values ($L_{01}, L_{02}, \ldots, L_{0n}$) of the gate lengths (L) to be an overlap length ($\Delta L$).

According to an eighth aspect of the present invention, there is provided a recording medium accessible through a computer, wherein each of a plurality of MISFETs varying in gate length (L) is formed in a surface region or in a well of the surface region of a semiconductor substrate of each of the MISFETS, wherein a plurality of DC bias voltages varying in value are sequentially applied to a gate of each of the MISFETs in a condition in which an AC voltage having a predetermined frequency is also applied to the gate, the recording medium storing therein an overlap-length calculating program for calcurating an overlap length of each of the MISFETS, the program being executed by the computer and comprising the steps of:

determining a regression line defined by a predetermined equation ($C_{GB}=aL+b$) through which the capacitance ($C_{GB}$) is represented by a function of the gate lengths (L), the regression line being determined at each of the DC bias voltages on the basis of the capacitance ($C_{GB}$) when the capacitance ($C_{GB}$) is supplied from a data input means, the capacitance ($C_{GB}$) appearing between the gate and the semiconductor substrate, or, between the gate and the well on each of the gate lengths (L) at each of the DC bias voltages;

calculating a plurality of values ($L_{01}, L_{02}, \ldots, L_{0n}$) of the gate lengths (L) on the basis of the regression line at each of the DC bias voltages when the capacitance ($C_{GB}$) becomes a value of zero; and judging the saturated or the largest one of the values ($L_{01}, L_{02}, \ldots, L_{0n}$) of the gate lengths (L) to be an overlap length ($\Delta L$).

In the foregoing, a preferable mode is one wherein each of a plurality of MISFETs varying in gate length (L) is formed in a surface region or in a well of the surface region of a semiconductor substrate of each of the MISFETs, wherein a plurality of DC bias voltages varying in value are sequentially applied to a gate of each of the MISFETs in a condition in which an AC voltage having a predetermined frequency is also applied to the gate, the recording medium storing therein an overlap-length calculating program for calcurating an overlap length of each of the MISFETS, the program being executed by the computer, the program further comprising the step of:

calculating the capacitance ($C_{GB}$) between the gate and the semiconductor substrate, or, between the gate and the well on each of the gate lengths (L) at each of the DC bias voltages, on the basis of a current and a voltage both supplied from data input means, the current and the voltage appearing between the gate and the semiconductor substrate, or, between the gate and the well of each of the MISFETs.

With the above construction, when the between gate/substrate (or gate/well) capacitance ($C_{GB}$) of the MOSFET is measured in each of the gate lengths (L), it is important to measure in capacitance only a region between the gate and the channel of the MOSFET in order to precisely determine the overlap length ($\Delta L$) of the MOSFET, so that the between gate/substrate capacitance ($C_{GB}$) of the MOSFET does not contain any other capacitance components, for example such as: capacitance components of a region between the gate and the source/drain diffusion regions (i.e., an overlap capacitance and a fringe capacitance); and, a capacitance component of a region between the source/drain diffusion region and the semiconductor substrate or well of the MOSFET.

In order to precisely determine the overlap length ($\Delta L$) of the MOSFET, it is necessary to measure, by means of the electric measuring means or instrument, only an electric current flowing through a region between the gate and the semiconductor substrate of the MOSFET, or through a region between the gate and the well of the MOSFET, in a condition in which the semiconductor substrate or well of the MOSFET is kept substantially at the same potential as that of the source/drain diffusion regions, or both of them are grounded. Preferably, it is necessary to prevent an electric current flowing through a region between the gate and the source/drain regions of the MOSFET from entering the electric measuring means when the between gate/substrate capacitance ($C_{GB}$) of the MOSFET is determined (as described in the second and the third aspect of the present invention).

Consequently, in the prevent invention having the above construction, it is possible to precisely determine the between gate/substrate capacitance ($C_{GB}$) of the MOSFET only in its channel region since it is possible to remove both the overlap capacitance and the fringe capacitance which cause the so-called "short channel effect" and "two dimensional effect", respectively. Incidentally, both the "short channel effect" and "two dimensional effect" become distinct when the channel region of the MOSFET is reduced in length.

As described above, in the present invention: first of all, the dependency of only the channel region of the MOSFET on the gate length (in general, the between gate/substrate capacitance ($C_{GB}$) is defined by the following equation: $C_{GB}=aL+b$) is precisely determined; then, the gate length of the MOSFET is gradually reduced in length until the between gate/substrate capacitance ($C_{GB}$) is equal to a value of zero, wherein the gate length ($L_0$) at the time when the between gate/substrate capacitance ($C_{GB}$) is equal to zero is estimated to be a value of the overlap length ($\Delta L$).

Because the reason why the between gate/substrate capacitance ($C_{GB}$) is equal to zero is that: when an overlap region between the gate and the source diffusion layer has its end region brought into contact with the corresponding end region of an overlap region between the gate and the drain diffusion layer, any channel region disappears. When the channel region of the MOSFET disappears as described above, the gate length ($L_0$) becomes the overlap length itself.

BRIEF DESCRIPTION OF THE DRAWINGS

The above and other objects, advantages and features of the present invention will be more apparent from the following description taken in conjunction with the accompanying drawings in which:

FIGS. 13A and 13B are sectional views of an essential part of the MOSFET, illustrating the mechanism of the overlap observed between the gate and the source/drain diffusion regions of the MOSFET in its production process.

DETAILED DESCRIPTION OF THE PREFERRED EMBODIMENTS

The best modes for carrying out the present invention will be described in detail using embodiments of the present invention with reference to the accompanying drawings.

First Embodiment

Figure 1:
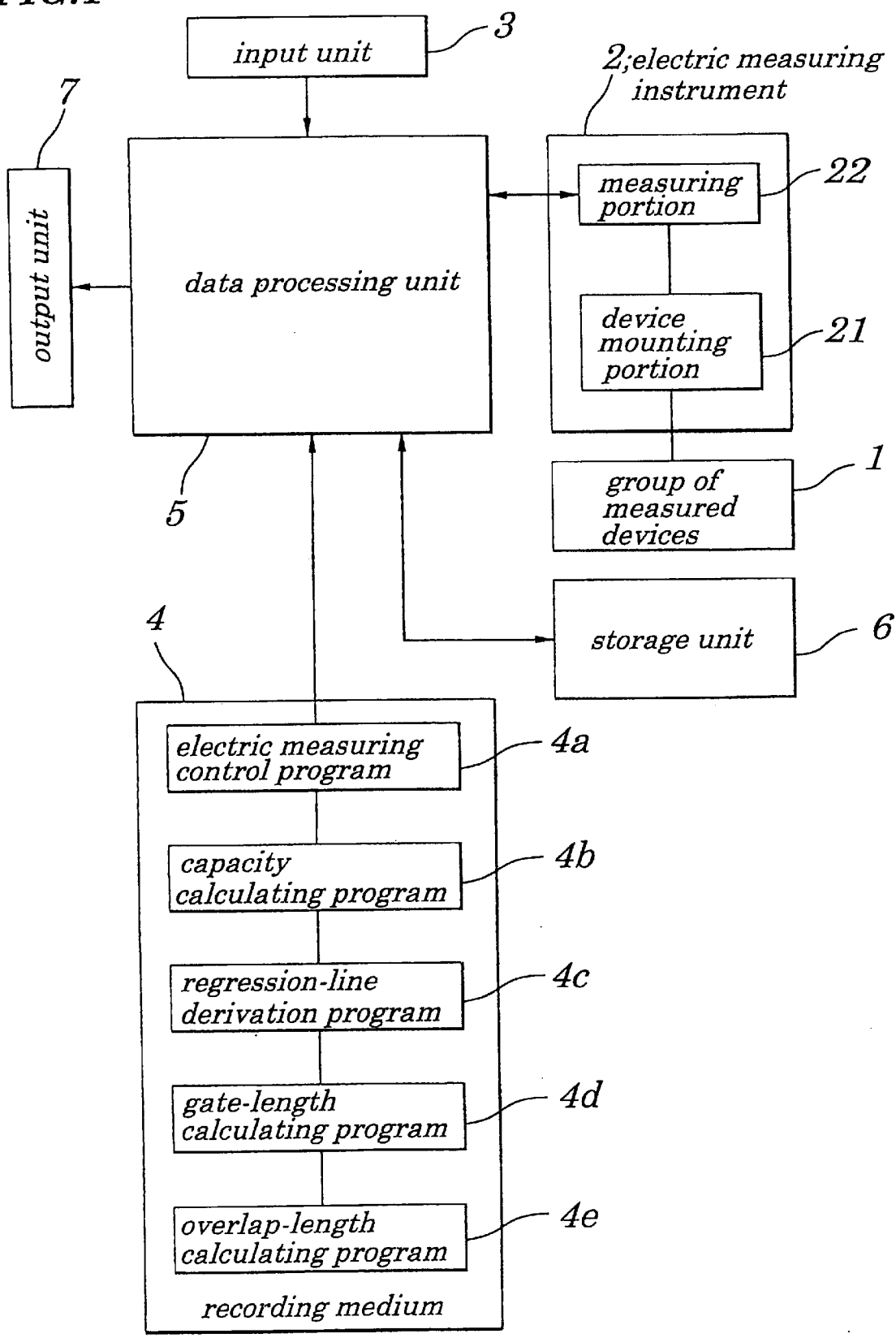
FIG. 1 is a functional block diagram of the apparatus of the first embodiment of the present invention for measuring the overlap length of the MOSFET.

FIG. 1 shows a functional block diagram of an apparatus of a first embodiment of the present invention for measuring an overlap length $\Delta L$ of an MOSFET. Further, FIG. 2 shows a circuit diagram of an electric measuring instrument forming the apparatus of the present invention shown in FIG. 1.

In this first embodiment of the present invention, the overlap length $\Delta L$ of the MOSFET is determined in a manner which is largely different from a conventional manner in that: as for a group 1 of to-be-measured devices (hereinafter simply referred to as the measured devices, i.e., a plurality of MOSFETs varying in gate length L), derivation of the overlap length ΔL of each of the MOSFETs according to the present invention is carried out through measurement of a between gate/substrate capacitance $C_{GB}$ of the MOSFET in each of the gate bias voltages ranging from Vg1 to Vg5 (shown in FIG. 5) of the MOSFET, not carrying out a conventional process for measuring in channel resistance each of the measured devices.

In order to carrying out such derivation of the overlap length ΔL of each of the MOSFETs according to the present invention in the above manner, as shown in FIG. 1, the apparatus of the first embodiment of the present invention comprises: an electric measuring instrument 2 for carrying a plurality of electric measurements required for calculation of the between gate/substrate capacitance $C_{GB}$ in a group 1 of measured devices; an input unit 3 such as keyboards, mouse means and the like; a recording medium 4 storing therein various types of processing programs; a data processing unit 5 such as CPUs and like processors operated under the control of the various types of processing programs described above; a storage unit 6 for temporarily storing therein various types of measured data, calculation data and like data; and, an output unit 7 such as display units, printer units and the like.

Figure 2:
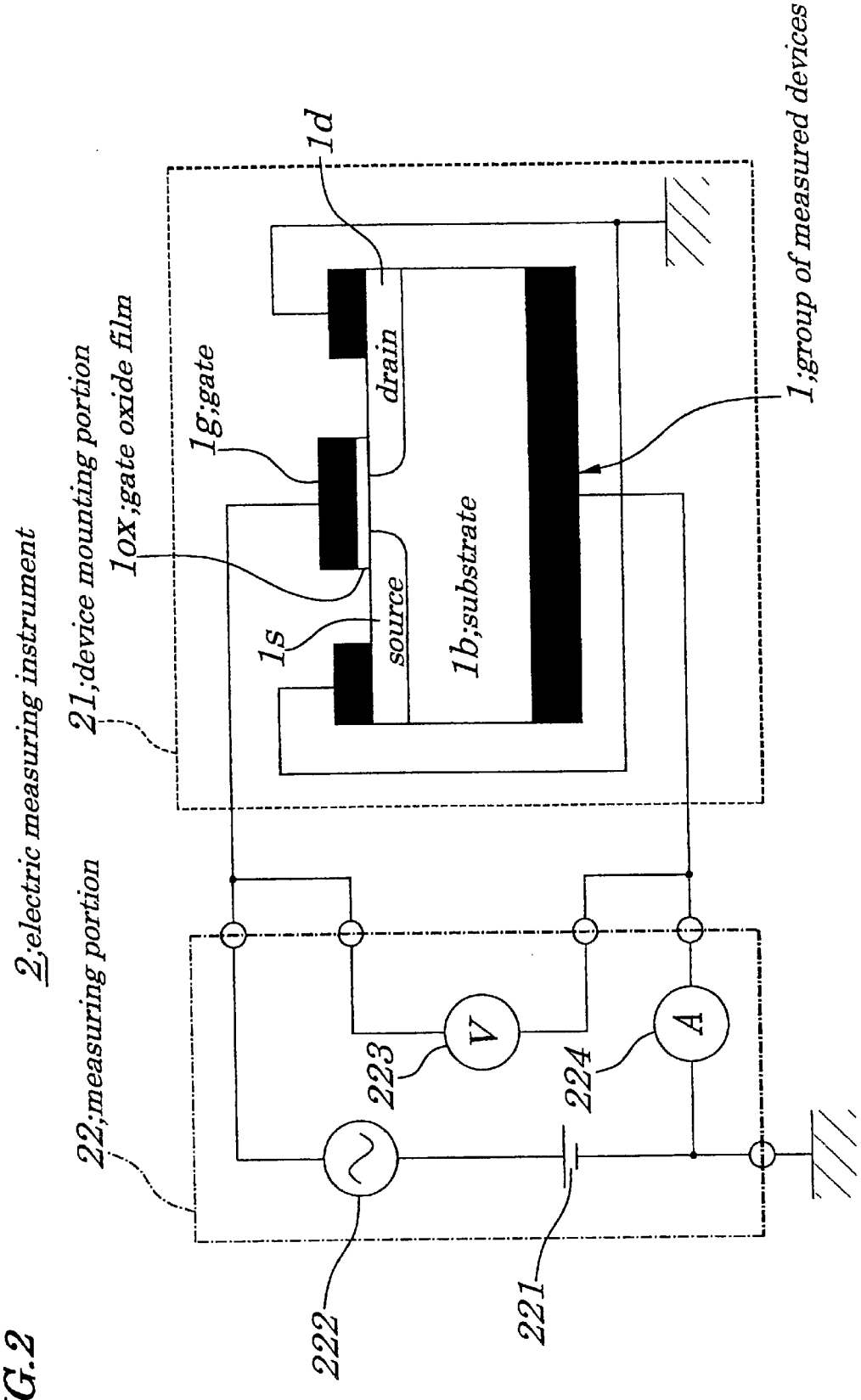
FIG. 2 is a circuit diagram of the electric measuring instrument forming the apparatus of the present invention shown in FIG. 1.

As shown in FIG. 2, the electric measuring means or instrument 2 is constructed of: a device mounting portion 21 through with the group 1 of the measured devices are mounted on the electric measuring instrument 2; and, a measuring portion 22 for measuring an electric current and a voltage in a region between a gate and a semiconductor substrate in each of the measured devices of the group 1 under the control of the data processing unit 5.

The device mounting portion 21 is provided with a plurality of connection terminals each electrically connected with each of a gate 1g, source diffusion layer region (hereinafter referred to simply as the source) 1s, drain diffusion layer region (hereinafter referred to simply as the drain) 1d and a semiconductor substrate (hereinafter referred to simply as the substrate) 1b in each of the measured devices in the group 1. Each of these connection terminals may be constructed of a probe needle of a wafer prober when the group 1 of the measured devices are fabricated on a semiconductor wafer, wherein the probe needle of the wafer prober is brought into contact with each of the measured devices in testing the group 1 of the measured devices fabricated on the wafer. In the case that the group 1 of the measured devices have been already mounted in a package, the above connection terminals of the device mounting portion 21 in the electric measuring instrument 2 may be constructed of a plurality of package-mounting sockets.

Figure 4:
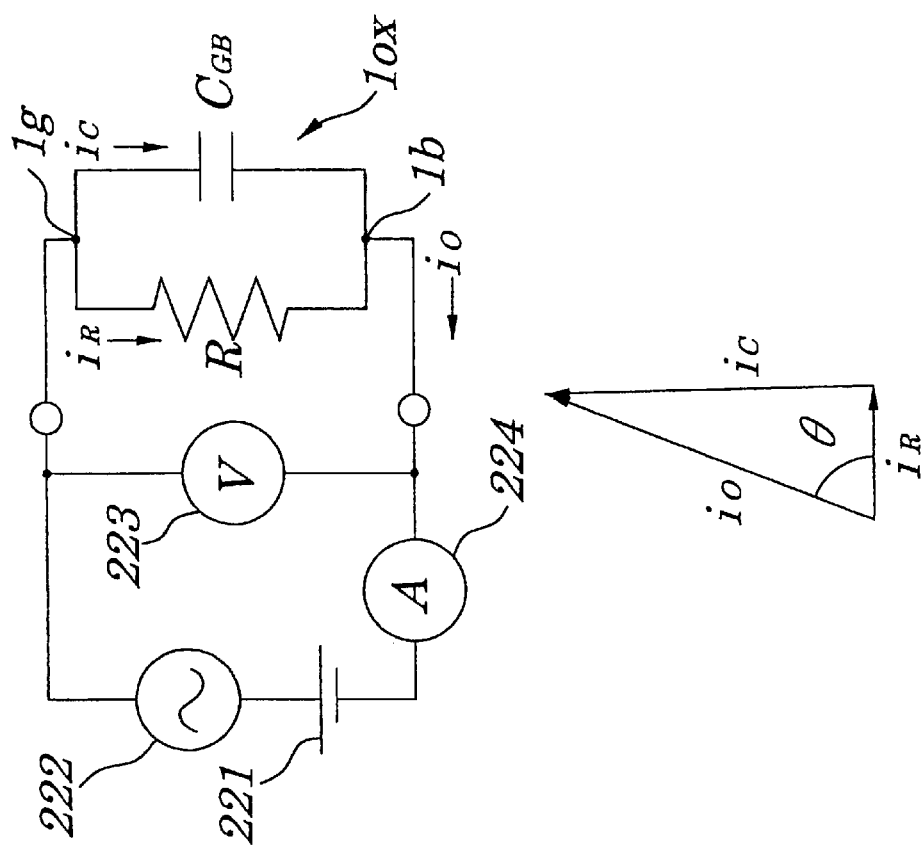
FIG. 4 is a circuit diagram equivalent to the arrangement of the MOSFET between its gate and its semiconductor substrate, illustrating a method for calculating the between gate/substrate capacitance ($C_{GB}$) of the MOSFET.

On the other hand, as shown in FIG. 4, the measuring portion 22 of the electric measuring instrument 2 (shown in FIG. 1) is provided with: a DC bias voltage supply 221; a AC voltage supply 222 connected in series with the DC bias voltage supply 221; a voltmeter 223 for measuring a voltage applied across the gate 1g and the semiconductor substrate 1b in each of the measured devices of the group 1; and, an ammeter 224 for measuring an electric current flowing from the gate 1g to the semiconductor substrate 1b of the measured device of the group 1.

In this first embodiment of the present invention, as shown in FIG. 4, the DC bias voltage supply 221 and the AC voltage supply 222 are connected in series with each other in the measuring portion 22 (shown in FIG. 1), wherein one of opposite output terminals of an assembly of the thus connected supplies 221, 222 is connected with the gate mounting terminal of the device mounting portion 21 of the electric measuring instrument 2 (shown in FIG. 1). On the other hand, the other of the opposite output terminals of such assembly of the supplies 221, 222 is grounded. As for the semiconductor substrate mounting terminal of the device mounting portion 21 of the electric measuring instrument 2, this substrate mounting terminal of the device mounting potion 21 is grounded through the ammeter 224. On the other hand, the remaining mounting terminals, i.e., the source mounting terminal and the drain mounting terminal of the device mounting portion 21 are grounded not through the ammeter 224. As shown in FIG. 4, the voltmeter 223 is interposed between the gate mounting terminal and the substrate mounting terminal of the device mounting portion 21 (shown in FIG. 1). As described above, each of the measured devices of the group 1 is electrically connected with the measuring portion 22 through the device mounting portion 21 of the electric measuring instrument 2, as shown in FIG. 1.

Further, in order to have the data processing unit 5 to perform various types of processing operations, the recording medium 4 carries a plurality of processing programs designed to serve various types of processing functions required for the above operations. Such processing programs comprise: an electric measuring control program 4a; a capacity calculating program 4b; a regression-line derivation program 4c; a gate-length calculating program 4d; and, an overlap-length calculating program 4e.

Of these processing programs, firstly, the electric measuring control program 4a makes the data processing unit 5 control the electric measuring instrument 2 in a manner such that: the electric measuring instrument 2 sequentially switches one by one the measured devices of the group 1, which devices vary in gate length, wherein the electric measuring instrument 2 sequentially varies the gate bias voltage to produce a series of gate bias voltages in each of which the electric measuring instrument 2 measures an electric current and voltage required for calculation of the between gate/substrate capacitance $C_{GB}$.

Secondly, the capacity calculating program 4b makes the data processing unit 5 execute an operation for calculating the between gate/substrate capacitance $C_{GB}$ on the basis of the measurement result of the electric measuring instrument 2 in each of the series of the gate bias voltages with respect to each of the measured devices which vary in gate length.

Thirdly, the regression-line derivation program 4c makes the data processing unit 5 execute an operation for derivation of regression coefficients "a" and "b" of a regression line (which is defined by the following equation: $C_{GB}=aL+b$) through the least squares method and the like in each of the series of the gate bias voltages on the basis of the between gate/substrate capacitance $C_{GB}$ having been calculated in each of the series of the gate bias voltages, with respect to each of the measured devices which vary in gate length.

Fourthly, the gate-length calculating program 4d makes the data processing unit 5 execute an operation for calculating the individual gate lengths $L_{01}, L_{02}, \ldots, L_{05}$ in each of the series of the gate bias voltages when the between gate/substrate capacitance $C_{GB}$ becomes a value of zero, on the basis of the individual regression lines (each defined by the equation: $C_{GB}=aL+b$) having been derived in each of the series of the gate bias voltages.

Lastly, the overlap-length calculating program 4e makes the data processing unit 5 execute an operation for assuming the saturated or the largest one of the gate lengths $L_{01}$, $L_{02}$, ..., $L_{05}$ as the overlap length $\Delta L$ of each of the measured devices of the group 1 when the between gate/substrate capacitance $C_{GB}$ having been obtained from each of the regression lines (each defined by the equation: $C_{GB}$= aL+b)) becomes a value of zero.

Incidentally, the recording medium 4 may assume any desirable form, for example such as: magnetic memory devices such as magnetic disks, magnetic tapes and the like; semiconductor memory devices such as ROMs, RAMs and the like; magnet-optical memory devices such as CD-ROMs and the like; optical memory devices; and, like recording media.

Next, with reference to a flowchart shown in FIG. 3, the data processing unit 5 of this first embodiment of the present invention will be described in operation.

First of all, it is necessary to prepare the group 1 of the measured devices through the same fabrication process as that used in fabrication of a device used in extracting the so-called device parameters, wherein: the measured devices of the group 1 are constructed of a plurality of n type MOS transistors varying in gate length L to have the gate lengths of $L_{01}$, $L_{02}$, ..., $L_{05}$; and, each of the measured devices of the group 1 has a channel width W of 10 $\mu$m and a gate oxide film thickness of 10 nm. These measured devices of the group 1 are previously mounted on the device mounting portion 21 of the electric measuring instrument 2. In this mounting operation, as shown in FIG. 2, each of the measured devices (i.e., n-type channel devices) of the group 1 has its gate 1g, source 1s, drain 1d and its semiconductor substrate 1b previously connected with the corresponding individual mounting terminals of the device mounting portion 21 of the electric measuring instrument 2, respectively.

As a result of the above previous mounting operation, both the DC bias voltage supply 221 and the AC voltage supply 222 are connected to the gate 1g of each of the measured devices of the group 1. On the other hand, the semiconductor substrate 1b (i.e., p-type silicon substrate) of each of the measured devices of the group 1 is grounded through the ammeter 224. Both the source mounting and the drain mounting terminal of the device mounting portion 21 of the electric measuring instrument 2 are grounded not through the ammeter 224. Incidentally, since the voltmeter 223 is interposed between the gate mounting terminal and the substrate mounting terminal of the device mounting portion 21 of the electric measuring instrument 2, it is possible to measure a voltage applied across the gate 1g and the semiconductor substrate 1b of each of the measured devices of the group 1.

Under the above conditions, as shown in FIG. 1, when an instruction for starting a measurement operation is given to the data processing unit 5, the electric measuring control program 4a makes the data processing unit 5 retrieve a necessary data from the recording medium 4, thereby controlling the data processing unit 5 in operation. Then, still under the control of the electric measuring program 4a, the data processing unit 5 execute an electric measuring procedure in a step SP1.

In this step SP1, the data processing unit 5 controls the electric measuring instrument 2 to have only the DC bias voltage supply 221 turned ON, so that on the DC bias voltage Vg is applied to each of the measured devices (i.e., n-type channel devices) of the group 1, whereby a DC voltage value E applied across the gate 1g and the semiconductor substrate 1b and a DC current value I flowing between the gate 1g and the semiconductor substrate 1b of each of the measured n-type channel devices of the group 1 are measured through the voltmeter 223 and the ammeter 224, respectively. The thus measured results are stored in the storage unit 6.

The above measurement operation is conducted as to at least one of the gate bias voltage values in a condition in which the gate bias voltage vg is fixed under the circumstances that each of the measured n-type channel devices remains turned OFF. In general, the above measurement operation is conducted under the circumstances that the measured n-type channel devices are sequentially switched one by one. This switching operation is realized by switching operations of switch means (not shown) provided in the measuring portion 22 of the electric measuring instrument 2, or realized by moving the probe needle of the wafer prober (not shown) relative to each of the measured n-type channel devices of the group 1 when the wafer prober (not shown) is used as the device mounting portion 21 of the electric measuring instrument 2, wherein the probe needle of the wafer prober is kept in contact with the surface of the wafer in testing each of the measured n-type channel devices of the group 1 while moved relative to the wafer. Such switching operation described above is under the control of the data processing unit 5.

Then, the AC voltage supply 222 is turned ON, so that both the DC bias voltage and the AC voltage having a frequency of from 100 KHz to 1 MHz with an amplitude of 100 mV are applied to each of the measured n-type channel devices of the group 1. Under such circumstances, the gate bias voltage is sequentially changed step by step at predetermined intervals so as to have a plurality of values of from Vg1 to Vg6. In each of these gate bias voltages of from Vg1 to Vg6, both the AC voltage value "e" applied across the gate 1g and the semiconductor substrate 1b of each of the measured n-type channel devices of the group 1 and the AC current value "$i_c$" flowing between the gate 1g and the semiconductor substrate 1b are measured by the volt meter 223 and the ammeter 224, respectively. The results of the above measurement are stored in the storage unit 6 shown in FIG. 1.

In this first embodiment of the present invention, in each of the measured n-type channel devices of the group 1, the gate bias voltage Vg supplied from the input unit 3 is varied in value at 1 volt intervals stepwise over its set-point range of from −4 volts to +1 volt, i.e., of from its accumulation state to the other state which is immediately before the formation of a conductive channel (i.e., inverted layer) under the gate oxide film 1ox between the source 1s and the drain 1d, as shown in FIG. 2. Under such circumstances, the AC current and the AC voltage components between the gate 1g and the semiconductor substrate 1b are measured in each of the above values or set points of the gate bias voltage Vg.

Actually, the above measurement is conducted until the channel (i.e., inverted layer) is formed under the gate oxide film 1ox between the source 1s and the drain 1d. Upon such formation of the channel, the AC current and the AC voltage components having been already measured before the formation of the channel are then stored in the storage unit 6 as effective measurement data. In this connection, for example, assuming that the channel (i.e., inverted layer) is formed under the gate oxide film 1ox when the gate bias voltage Vg is set at its set point Vg6 equal to +1 volt, those of the AC current and the AC voltage components measured at the set points Vg1, Vg2, Vg3, Vg4 and Vg5 of the gate bias voltage Vg equal to −4 volt, −3 volt, −2 volt, −1 volt and 0 volt, respectively, are recognized to be effective measurement data, and, therefore stored in the storage unit 6.

Incidentally, the ammeter 224 makes it possible to determine whether or not the channel is formed under the gate oxide film 1ox. In other words, when a drastic reduction in AC current is observed through the ammeter 224, it is judged that the channel is formed. This is because: the AC current, which flows between the gate 1g and the semiconductor substrate 1b before the formation of the channel, now flows through the channel from the source 1s to the drain 1d of each of the measured n-type channel devices of the group 1. In other words, it is impossible to measure the between gate/substrate capacitance $C_{GB}$ after the formation of the channel (i.e., inverted layer) under the gate oxide film 1ox.

Figure 3:
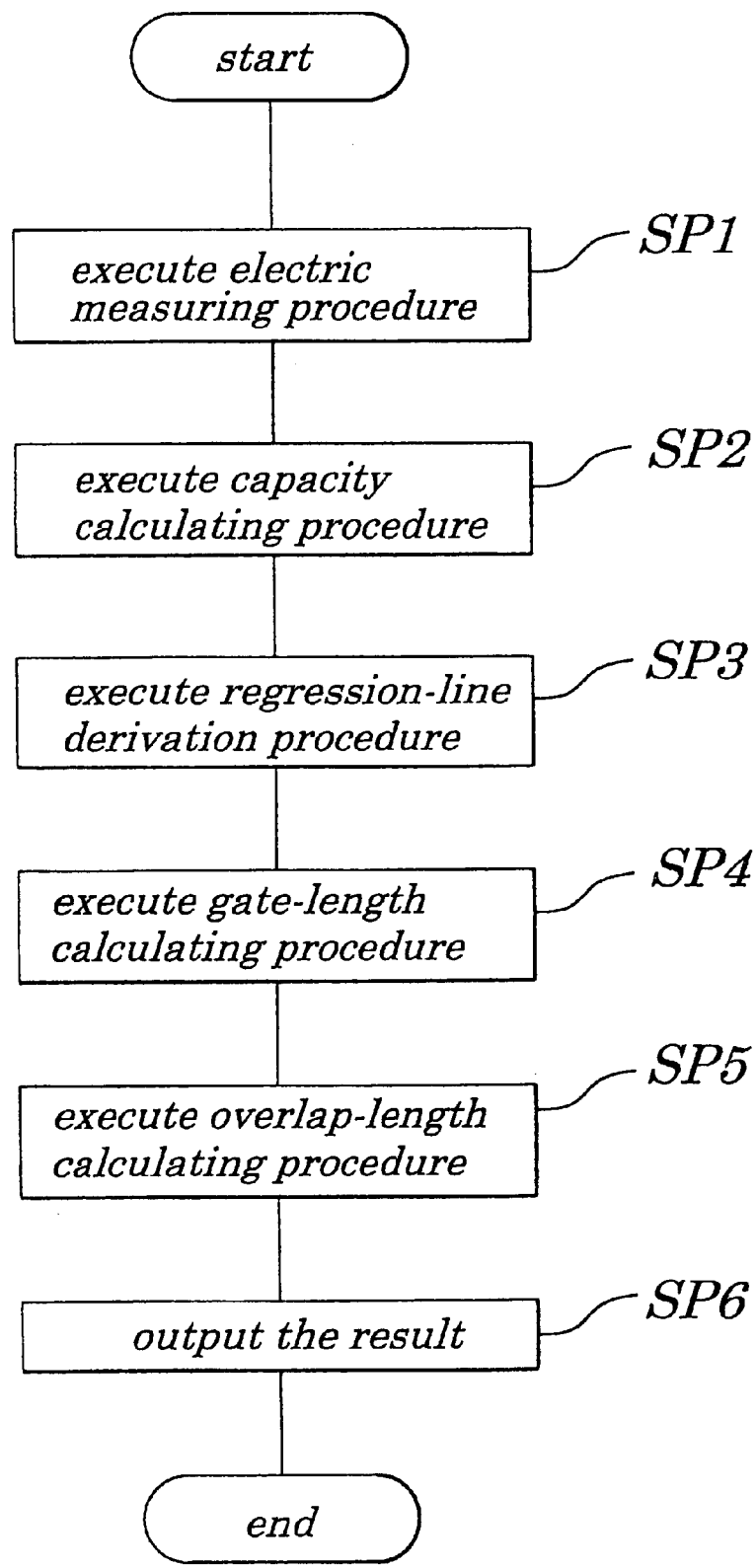
FIG. 3 is a flowchart of a data processing program performed in the data processing unit of the apparatus of the present invention shown in FIG. 1.

As shown in the flowchart of FIG. 3, after completion of the electric measurement in the step SP1, this step SP1 is followed by a subsequent step SP2 in which: the data processing unit 5 retrieves the capacity calculating program 4b from the recording medium 4, and is controlled by this program 4b in operation. Namely, in the step SP2, the data processing unit 5 executes a capacity calculating procedure (shown in FIG. 3) under the control of the capacity calculating program 4b.

More specifically, in the step SP2, the data processing unit 5 retrieves the data such as "E", "I", "e" and "$i_o$", which have been measured in each of the set points of the gate bias voltage Vg with respect to each of the measured n-type channel devices of the group 1 by the used of the electric measuring instrument 2 in the foregoing step SP1, and stored in the storage unit 6. Further, in the step SP2, the data "E", "I", "e" and "$i_o$" thus retrieved from the storage unit 6 are substituted in a series of the following Equations (5) to (8) which are derived from the equivalent circuit (i.e., parallel circuit in which a resistor having a resistance of "$R_{GB}$" and a capacitor having a capacitance of "$C_{GB}$" are connected across the same gate 1g and the same semiconductor substrate 1b) disposed between the gate 1g and the substrate 1b shown in FIG. 4, so that the between gate/substrate capacitance $C_{GB}$ is calculated in each of the set points of the gate bias voltage Vg with respect to each of the measured n-type channel devices of the group 1. Incidentally, in calculating the between gate/substrate capacitance $C_{GB}$, in the case that pad capacitance and wiring capacitance are not ignored, it is necessary to previously measure both the pad capacitance and the wiring capacitance. The pad capacitance and the wiring capacitance thus measured previously are then subtracted from a measured value of the between gate/substrate capacitance $C_{CB}$, so that an effective value of the between gate/substrate capacitance $C_{GB}$ is obtained.

$$R = E/I \tag{5}$$

where
R is a between gate/substrate resistance (i.e., resistance of the gate oxide film 1ox);
E is a measured value of the DC voltage component applied across the gate 1g and the semiconductor substrate 1b; and
I is a measured value of the DC current component flowing between the gate 1g and the semiconductor substrate 1b.

$$i_R = e/R \tag{6}$$

where $i_R$ is an AC current component flowing between the gate 1g and the semiconductor substrate 1b.

$$i_o^2 = i_R^2 + i_C^2 \tag{7}$$

where
$i_C^2$ is an AC current component flowing between the gate 1g and the semiconductor substrate 1b;
$i_o^2$ is a measured value of the AC current component flowing through the ammeter 224.

$$C_{GB} = i_C/\omega e = (i_o^2 - i_R^2)^{1/2}/\omega e \tag{8}$$

where
$C_{GB}$ is the between gate/substrate capacitance; and
ω is an angular frequency of the AC current.

The between gate/substrate capacitance $C_{GB}$ thus calculated is given to the regression-line derivation program 4c which is subsequently carried out.

Under the control of the regression-line derivation program 4c thus actuated, the data processing unit 5 executes the regression-line derivation procedure in a step SP 3 which follows the step SP2, as shown in the flowchart of FIG. 3.

More specifically, in the step SP 3, by the use of the method of least squares and like methods, the data processing unit 5 calculates both the coefficients "a" and "b" of the regression line (represented by an equation of $C_{GB}$=aL+b) in each of the set points of the gate bias voltage Vg on the basis of the between gate/substrate capacitance $C_{GB}$ calculated in each of the set points of the gate bias voltage Vg with respect to each of the measured n-type channel devices of the group 1 which vary in gate length so as to have gate lengths L1, L2, L3, . . . .

Figure 5:
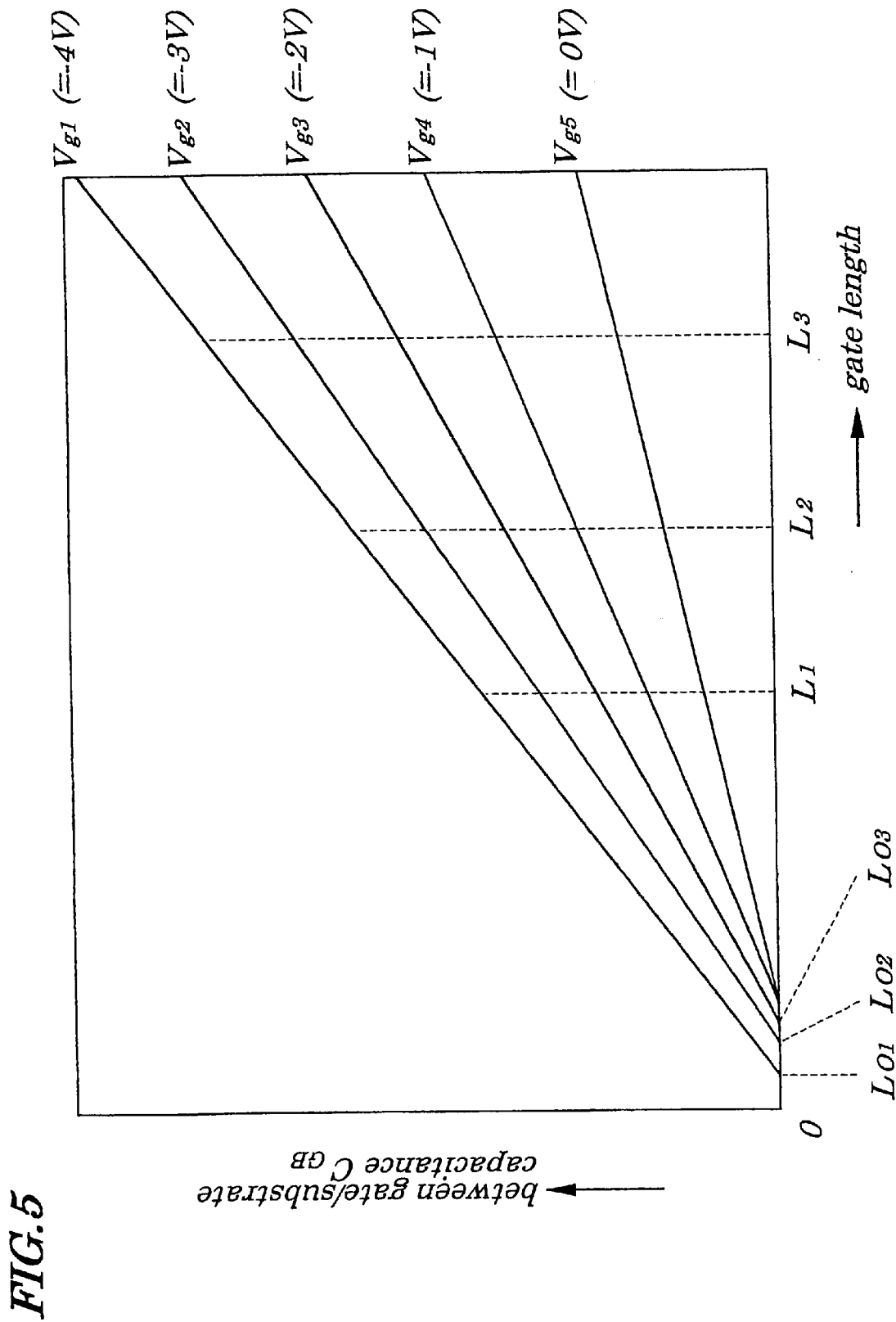
FIG. 5 is a characteristic diagram of the MOSFET, illustrating the group of the regression lines each representing the dependency of the between gate/substrate capacitance ($C_{GB}$) on the gate length in the MOSFET in each of the gate bias voltages (ranging from Vg1 to Vg5)

FIG. 5 shows a characteristic diagram of the MOSFET, illustrating the group of the regression lines each representing the dependency of the between gate/substrate capacitance $C_{GB}$ on the gate length in the MOSFET in each of the gate bias voltages ranging from Vg1 to Vg5 which correspond to a range of voltages of from −4 to 0 volt, respectively, wherein each of these regression lines is determined through a so-called interpolation operation by the use of the method of least squares in the step SP3 which is followed by a subsequent step SP4.

Figure 6:
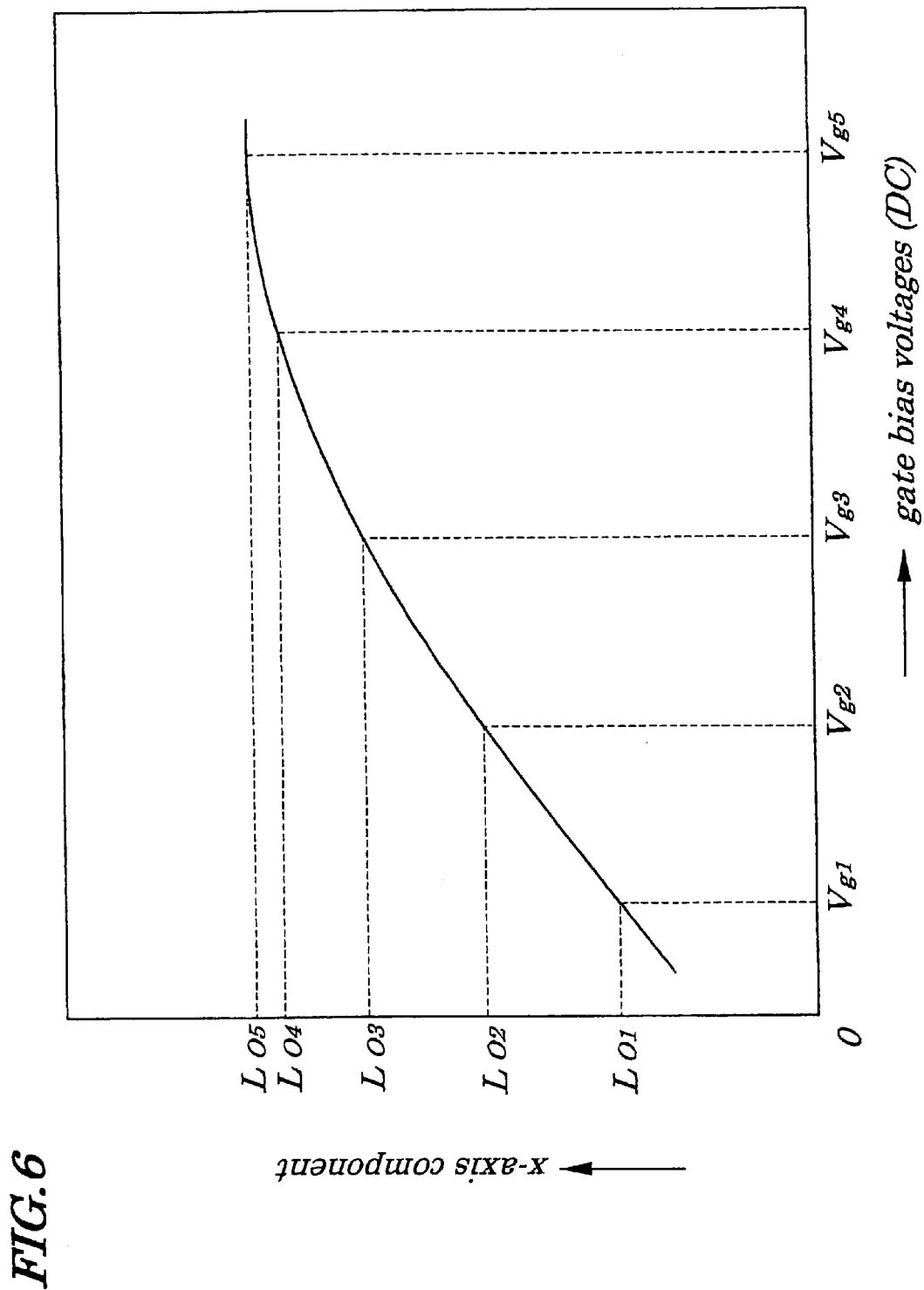
FIG. 6 is a characteristic diagram of the MOSFET, illustrating the relationship between the x-axis components of the regression lines shown in FIG. 5 and the gate bias voltages (DC) in the MOSFET.

As shown in FIG. 3, in this step SP4, the data processing unit 5 is controlled by the gate-length calculating program 4d to calculate each of the gate lengths $L_{O1}$, $L_{O2}$, . . . , $L_{O5}$ in each of the set points of the gate bias voltage Vg when the between gate/substrate capacitance $C_{GB}$ becomes a value of zero, on the basis of the individual regression lines (each defined by the equation: $C_{GB}$=aL+b) having been derived in each of the set points of the gate bias voltage Vg. As shown in FIG. 6, each of these gate lengths $L_{O1}$, $L_{O2}$, . . . , $L_{O5}$ represents an x-axis component of each of the regression lines shown in FIG. 5. This step SP4 is followed by a subsequent step SP5.

In the step SP5, the data processing unit 5 is controlled by the overlap-length calculating program 4e, and judges that the saturated or largest one $L_{O5}$ (see FIG. 6) of the gate lengths $L_{O1}$, $L_{O2}$, . . . , $L_{O5}$ is a values of the overlap length ΔL of each of the measured devices of the group 1 when the between gate/substrate capacitance $C_{GB}$ having been obtained from each of the regression lines (each defined by the equation: $C_{GB}$=aL+b)) becomes a value of zero.

The reason why the above assumption is proper is that: namely, due to the fabrication process of the measured devices, the overlap length ΔL of each of the devices which vary in gate length so as to have the gate lengths $L_{O1}$, $L_{O2}$, . . . , $L_{O5}$ is constant irrespective of the size of the gate length L, as already described in the above item: "Description of the Related Art".

Consequently, when the gate length L is gradually decreased, the source 1s is eventually brought into contact with the drain 1d even when the gate 1g still remains, which means that the effective channel length Leff becomes a value of zero, i.e., means that the gate length L has the same value as that of the overlap length ΔL, without fail. In this eventual state, since the source 1s shorts to the drain 1d, the between gate/substrate capacitance $C_{GB}$ becomes a value of zero. Consequently, it is possible to find out the overlap length ΔL by determining a value of the gate length L when the between gate/substrate capacitance $C_{GB}$ becomes zero, wherein the thus determined value of the gate length corresponds to the overlap length ΔL.

Figure 7A:
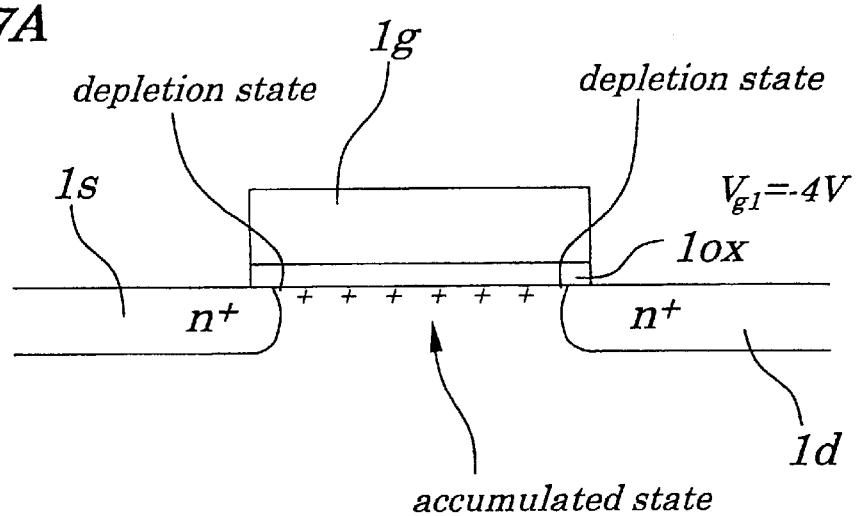
FIGS. 7A, 7B and 7C are sectional views of an essential part of the MOSFET, illustrating the procedures for calculating the overlap length ($\Delta L$) of the MOSFET.

Incidentally, the reason why any one of the remaining gate lengths $L_{01}$, $L_{02}$, . . . , $L_{04}$ which is not the saturated or largest one of the gate lengths should not be judged to be the overlap length ΔL is as follows: namely, As shown in FIG. 7A, at the set point Vg1 (i.e., −4 volt) of the gate bias voltage vg, majority carriers (i.e., holes) are attracted from the p-region to the surface underneath the gate oxide film 1ox between the source 1s and the drain 1d to form a channel therebetween, which channel has the majority holes concentrated or accumulated in its surface underneath the gate oxide film 1ox, and is therefore in an advanced state of accumulation. At this time, as shown in FIG. 7A, since the overlap regions are located between the opposite end portions of the gate oxide film 1ox and the opposite-side $n_+$ regions (i.e., the source 1s and the drain 1d), minority carriers (i.e., electrons) substantially disappear from these overlap regions located underneath the gate oxide film 1ox, so that each of the overlap regions is in a state of depletion in which the overlap regions are depleted of electrons). Due to this, the between gate/substrate capacitance $C_{GB}$ tends to increase in comparison with the case that the gate bias voltage Vg is set at any one of the set points of from Vg2 (i.e., −3 volts) to Vg5 (i.e., zero volt). In contrast with this, in each of the overlap regions, the between gate/substrate capacitance $C_{GB}$ decreases in proportion to the state of depletion thereof. Consequently, the gate length (i.e., apparent overlap length) is decreased when the between gate/substrate capacitance $C_{GB}$ becomes zero (see FIG. 5).

Figure 7B:
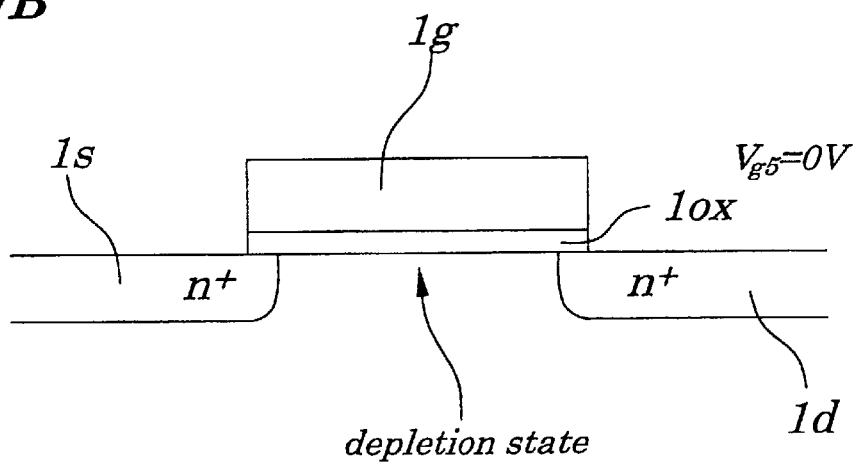

Next, as shown in FIG. 7B, when the gate bias voltage Vg is set at the set point Vb5 (i.e., zero volt), substantially all the holes disappear from the channel underneath the gate oxide film 1ox. In other words, the channel is depleted of the holes. Consequently, the between gate/substrate capacitance $C_{GB}$ tends to decrease in comparison with the case of the set points of from Vg1 (i.e., −4 volts) to Vg4 (i.e., zero volt) of the gate bias voltage Vg. However, in this case of FIG. 7B, since any depletion layer is not produced in each of the overlap regions, the overlap length ΔL assumes the most exact value.

Figure 7C:
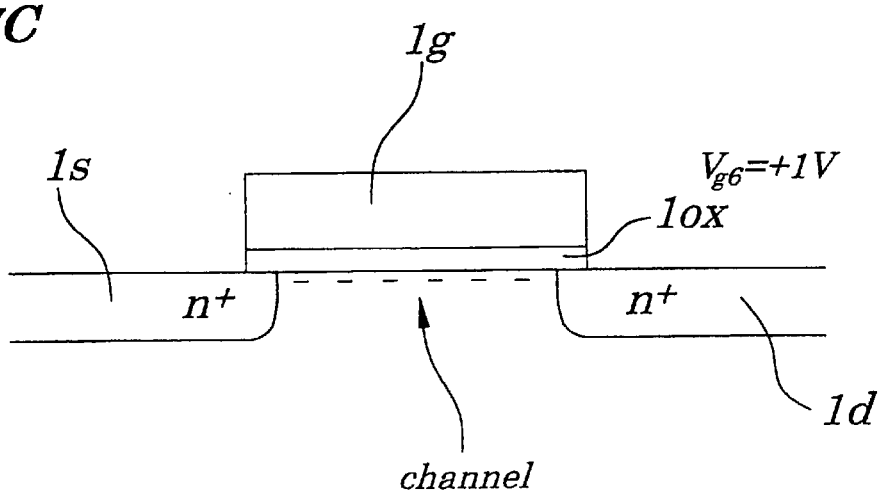

Then, as shown in FIG. 7C, when the gate bias voltage Vg is set at the set point Vb6 (i.e., +1 volt), minority carriers (i.e., electrons) are attracted from the p-region to the surface underneath the gate oxide film 1ox to form an inverted layer (i.e., channel), which makes it impossible to measure the between gate/substrate capacitance $C_{GB}$. As described above, the overlap length ΔL assumes the most exact value in a condition shown in FIG. 7B.

The above step SP5 of the flowchart shown in FIG. 3 is followed by a subsequent step SP6.

In the step SP6, various measured values of the overlap length ΔL are issued to the output unit 7. If necessary, it is also possible to issue both characteristic diagrams of FIGS. 5 and 6 to the output unit 7.

As described above, in this first embodiment of the present invention, since the electric measurement is conducted between the gate 1g and the semiconductor substrate 1b in a condition in which both the source 1s and the drain 1d of each of the measured n-type channel devices are grounded not passed through the ammeter 224, it is possible to remove both the overlap capacitance and the fringe capacitance which cause the so-called "short channel effect" and "two dimensional effect", respectively. Incidentally, both the "short channel effect" and "two dimensional effect" become distinct when the channel region of the MOSFET is reduced in length. Consequently, it is possible to precisely determine a value of the between gate/substrate capacitance $C_{GB}$ only in its channel region. As a result, in the above, since the overlap length ΔL is determined on the basis of the thus determined exact value of the between gate/substrate capacitance $C_{GB}$ only in the channel region, it is possible to determine the exact value of the overlap length ΔL.

Second Embodiment

Figure 8:
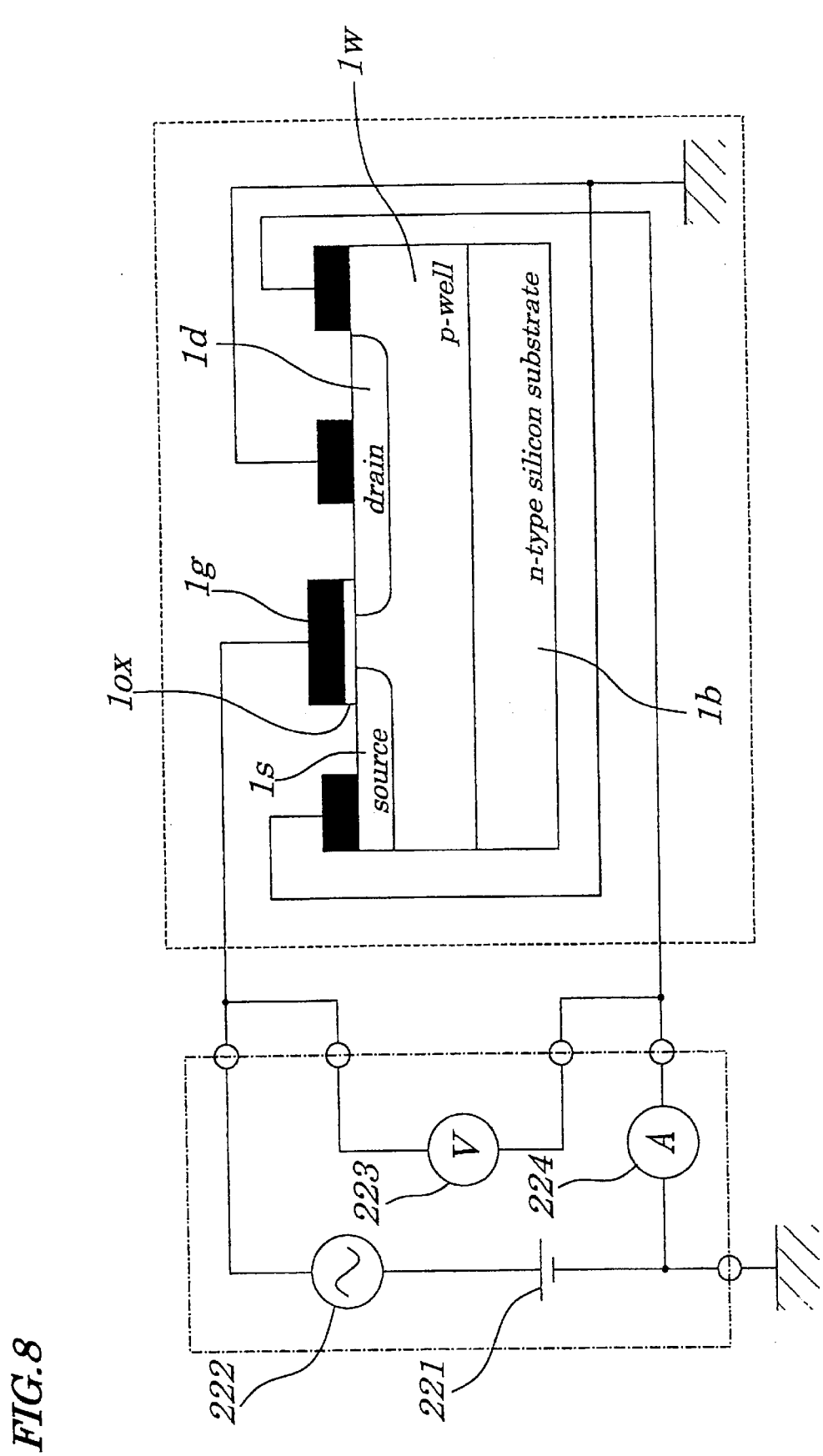
FIG. 8 is a circuit diagram of the electric measuring instrument, illustrating the second embodiment or method of the present invention for measuring the overlap length of the MOSFET.

FIG. 8 shows a circuit diagram of the electric measuring instrument 2, illustrating a method of the present invention for measuring the overlap length of the measured devices which are cMOSFETs.

The method of this second embodiment of the present invention for measuring the overlap length of the cMOSFETs is different from the corresponding method performed in the apparatus of the first embodiment of the present invention shown in FIG. 2, as follows:

First, in place of the between gate/substrate capacitance $C_{GB}$ of the first embodiment of the present invention shown in FIG. 2, a between gate/well capacitance is measured in this second embodiment of the present invention, as is clear from FIG. 8. Here, since a p-well shown in FIG. FIG. 8 is constructed of a p-region and both the source 1s and the drain 1d are formed in the surface of the p-region as is in the construction of the first embodiment in which both the source 1s and the drain 1d are formed in the surface of the semiconductor substrate 1b which is also constructed of a p-region, the between gate/well capacitance measured in this second embodiment of the present invention will be hereinafter denoted by the same reference letter as that (i.e., $C_{GB}$) of the between gate/substrate capacitance of the first embodiment of the present invention.

In the device mounting portion 21 of the electric measuring instrument 2 used in the second embodiment of the present invention shown in FIG. 8, a well mounting terminal is used in place of the substrate mounting terminal, and grounded through the ammeter 224. The remaining construction of the apparatus (shown in FIG. 8) of the present invention used in this second embodiment is substantially the same as that of the apparatus (shown in FIG. 2) of the first embodiment of the present invention.

Consequently, according to the second embodiment of the present invention having the above arrangement, it is possible to calculate the overlap length even in each of the CMOSFETs in each of which both the source 1s and the drain 1d are formed in the p-well, as shown in FIG. 8.

Third Embodiment

Figure 9:
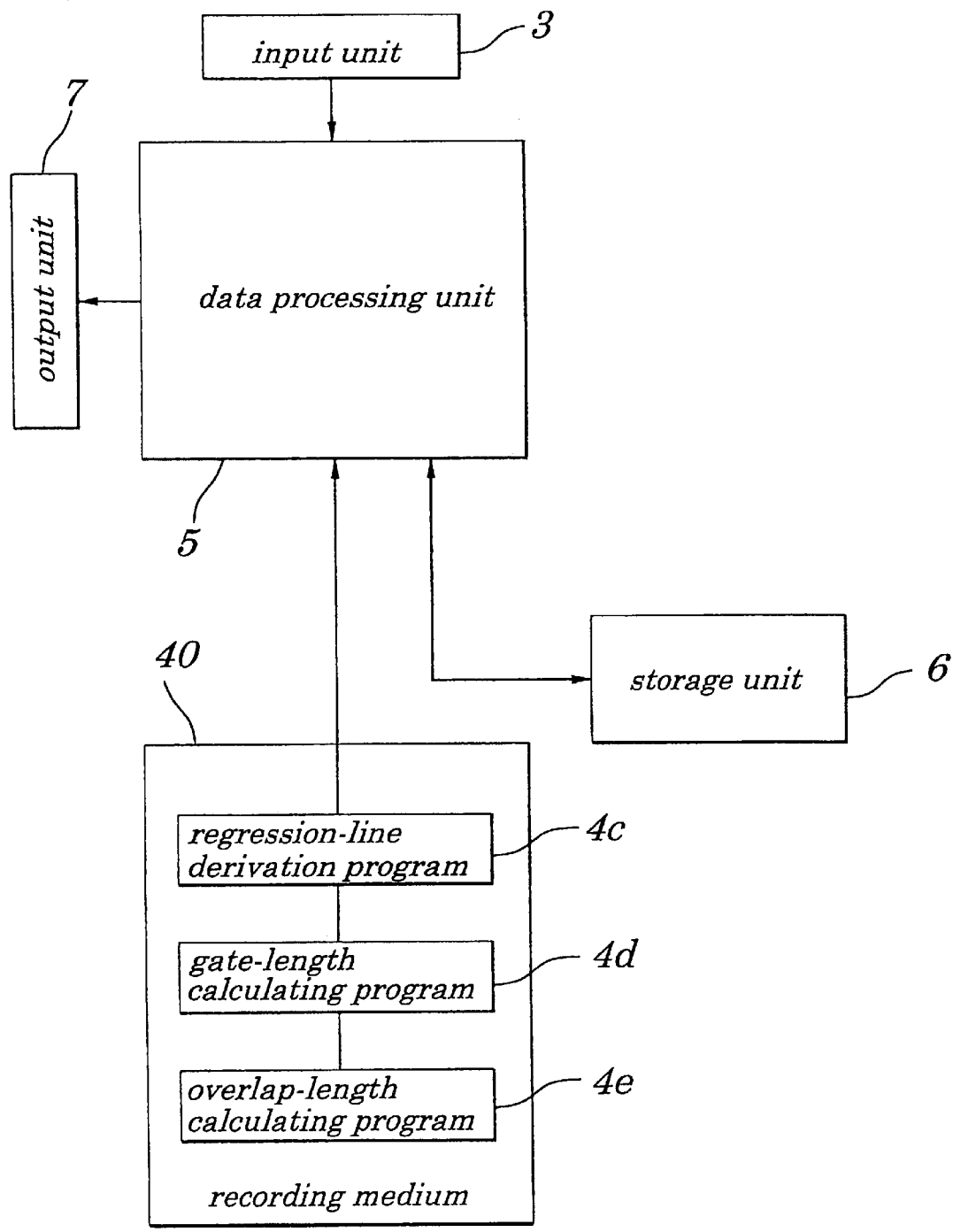
FIG. 9 is a functional block diagram of the apparatus of the third embodiment of the present invention for measuring the overlap length of the MOSFET.
Figure 10:
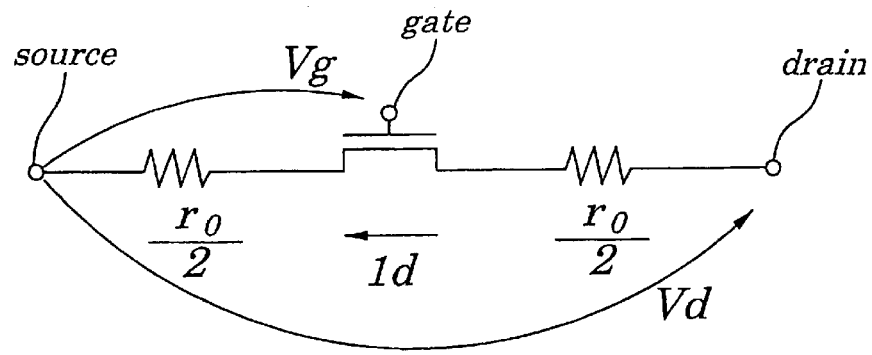
FIG. 10 is a circuit diagram equivalent to the arrangement of the MOS transistor.
Figure 11:
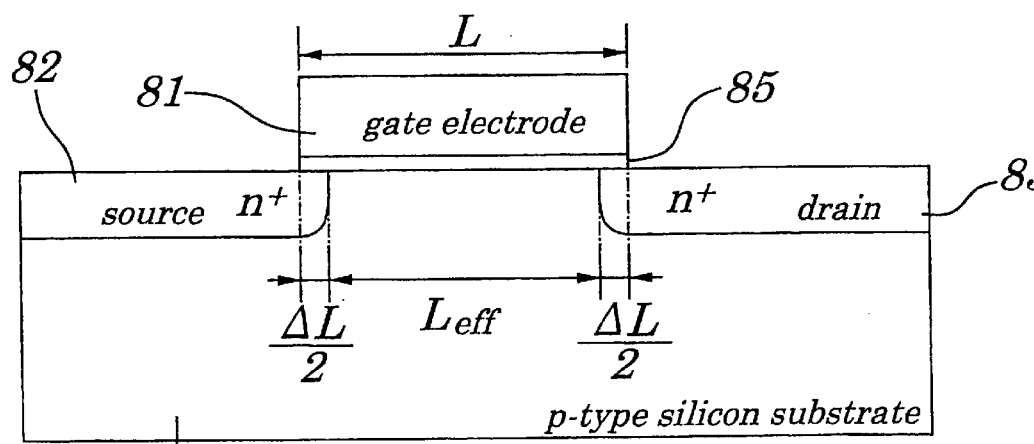
FIG. 11 is a sectional view of an essential part of the device model shown in FIG. 10, illustrating its overlap length ($\Delta L$) which is one of important physical parameters.
Figure 12:
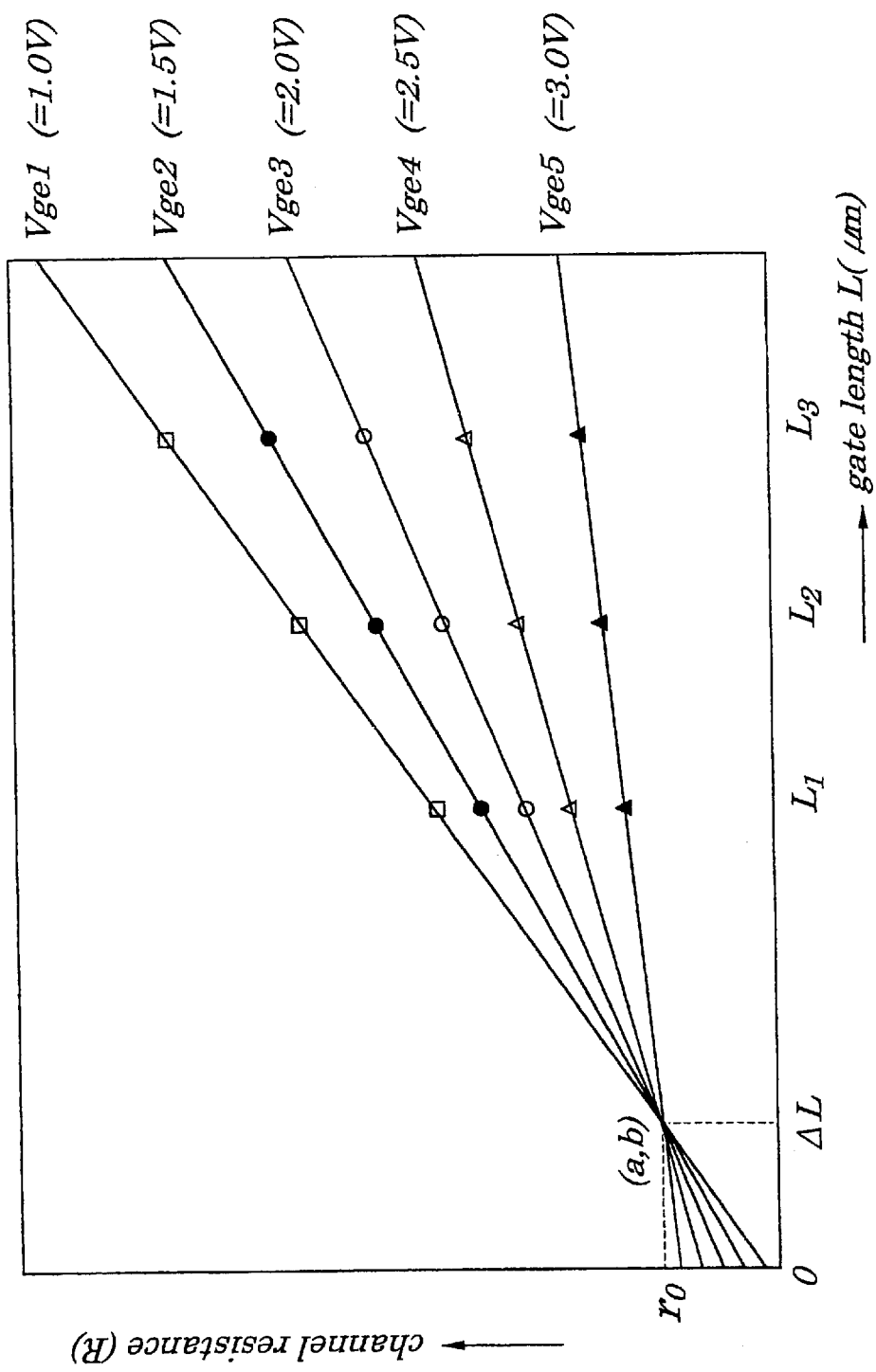
FIG. 12 is a characteristic diagram of the MOSFET, illustrating the conventional method of derivation of the overlap length ($\Delta L$) of the MOSFET, more specifically, illustrating the dependency of the channel resistance (R) on the gate length (L) in the MOSFET in each of the effective gate voltages (ranging from Vge1 to Vge5)
Figure 13B:
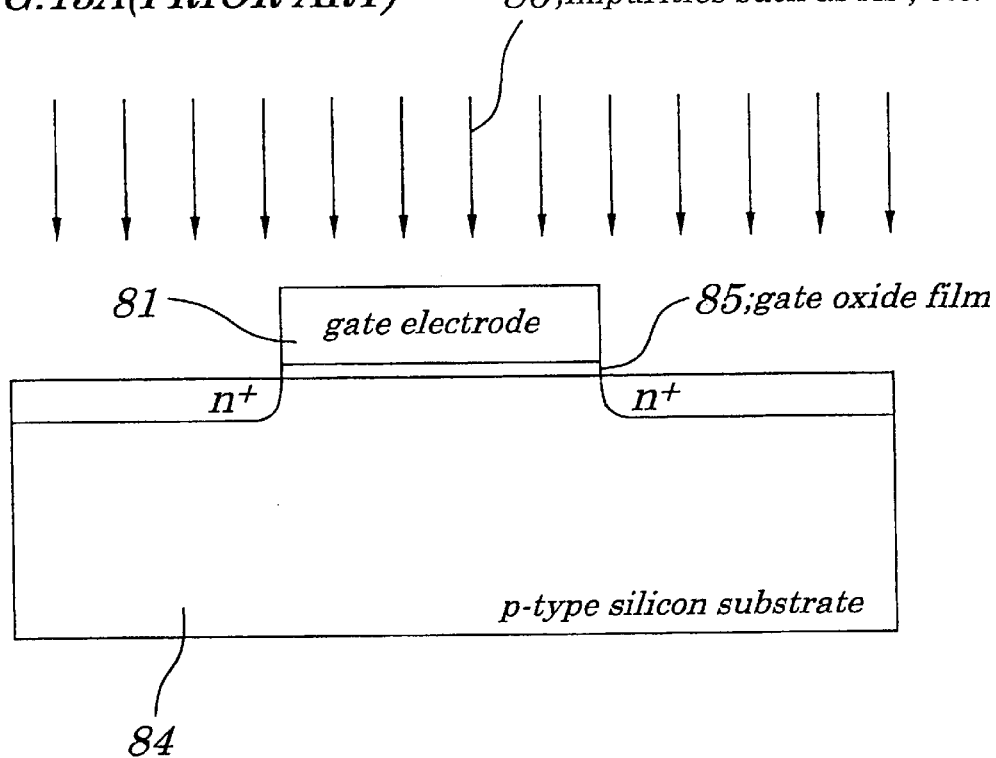
Figure 13B:
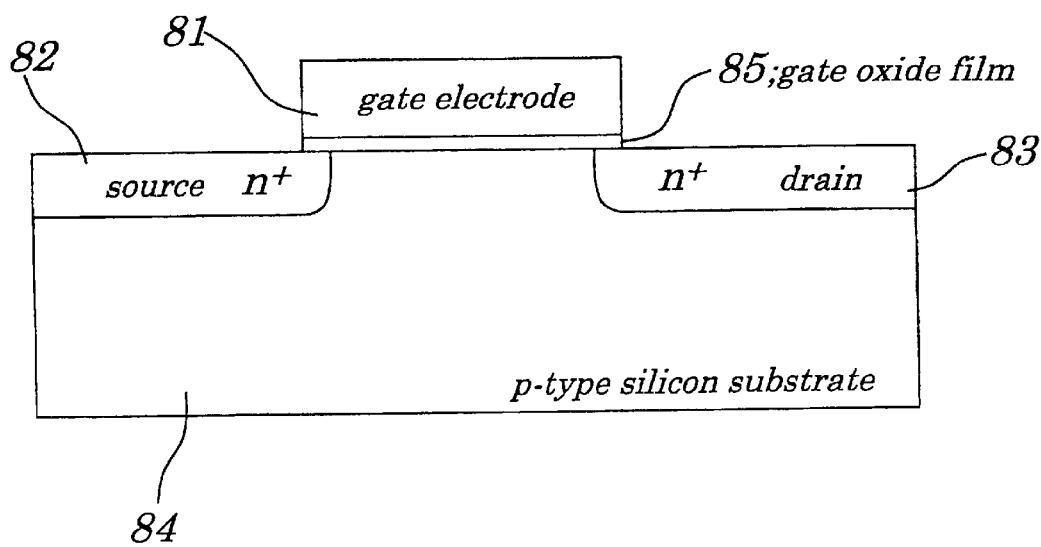

FIG. 9 shows a functional block diagram of the apparatus of a third embodiment of the present invention for measuring the overlap length of the MOSFET.

The apparatus of this third embodiment of the present invention is remarkably different from the apparatus of the first embodiment of the present invention in the following points: namely, in this third embodiment, the electric measuring instrument 2 (shown in FIG. 1) is not used; and, both the electric measuring control program 4a and the capacity calculating program 4b are removed from the storage medium 4 shown in FIG. 1.

In other words, as shown in FIG. 9, this third embodiment of the apparatus of the present invention is constructed of: an input unit 3 such as keyboards, mouse means and the like; a recording medium 40 storing therein various types of processing programs; a data processing unit 5 such as CPUs and like processors operated under the control of the various types of processing programs described above; a storage unit 6 for temporarily storing therein various types of measured data, calculation data and like data; and, an output unit 7 such as display units, printer units and the like.

Stored in the recording medium 40 are various types of processing programs under the control of which the data processing unit 5 executes various processing procedures, wherein the processing programs comprise: the regression-line derivation program 4c; the gate-length calculating program 4d; and, the overlap-length calculating program 4e.

In the construction of the third embodiment of the present invention having the above construction, the various types of the procession programs comprising the regression-line derivation program 4c, gate-length calculating program 4d, and the overlap-length calculating program 4e are sequentially retrieved one by one from the recording medium 40 and stored in the data processing unit 5 to control the unit 5 in operation. Namely, under the control of each of the various types of the processing programs 4c, 4d and 4e, the data processing unit 5 execute each of the regression-line derivation operation, gate-length calculating operation, and the overlap-length calculating operation.

More specifically, in the regression-line derivation operation executed by the data processing unit 5 under the control of the regression-line derivation program 4c shown in FIG. 9, when the between gate/substrate capacitance $C_{GB}$ properly prepared at each of the set points of the gate bias voltage Vg with respect to each of the measured n-type channel devices is issued from the input unit 3 to the data processing unit 5, the data processing unit 5 calculates both the coefficients "a" and "b" of the regression line (represented by an equation of $C_{GB}$=aL+b) by the use of the method of least squares and like methods at each of the set points of the gate bias voltage Vg on the basis of the between gate/substrate capacitance $C_{GB}$ calculated at each of the set points of the gate bias voltage Vg with respect to each of the measured n-type channel devices of the group 1 which vary in gate length so as to have gate lengths L1, L2, L3, . . . . Both the gate-length calculating procedure and the overlap-length calculating procedure sequentially subsequent to the above regression-line derivation procedure are substantially the same as those described in connection with the first embodiment of the apparatus of the present invention, and, therefore not described again to avoid redundancy in description.

In the above construction of the third embodiment, it is possible to use a general-purpose type data processing unit as the data processing unit 5. In this respect, the third embodiment of the apparatus of the present invention is excellent in easiness in use.

Fourth Embodiment

Now, a device model of the MOSFET according to a fourth embodiment of the present invention will be described.

The device model of this fourth embodiment of the present invention is defined by the following Equation (9) in which a drain current Id is defined by a function of various parameters such as: a threshold voltage Vth; a between gate/source diffusion layer resistance $r_0$; an effective mobility $\mu e$ of carriers depending on the gate voltage VG; and, an effective channel length Leff:

$$Id=f(L, \Delta L, W, Vth, r_0, VG, \ldots, \mu e) \tag{9}$$

The device model of this fourth embodiment of the present invention described above is remarkably different from a conventional device model disclosed in Japanese Laid-Open Patent Application No. Hei7-176740, as follows: namely, in place of the overlap length which is calculated on the dependency of the channel resistance R on the gate length L and denoted by the reference letter $\Delta L_R$, an overlap length $\Delta L_C$ is calculated on the dependency of the between gate/substrate capacitance $C_{GB}$ on the gate length L in this third embodiment of the present invention; and, the effective channel length Leff is obtained by subtracting the thus calculated overlap length $\Delta L_C$ from the gate length L (i.e., Leff=L−$\Delta L_C$) in this third embodiment of the present invention.

In the above construction of the fourth embodiment, it is possible to determine an exact value of the overlap length $\Delta L$ since the overlap length $\Delta L$ is determined on the basis of the between gate/substrate capacitance $C_{GB}$ of only the channel region not including the overlap capacitance and the fringe capacitance both of which become remarkable when the channel length is decreased. More specifically, since the effective channel length Leff is calculated with the use of such exact value of the overlap length $\Delta L$, the effective channel length Leff thus calculated also assumes an exact value. Consequently, it is possible for the device model of the MOSFET according to this fourth embodiment of the present invention to simulate the actual device characteristics in more precise manner.

It is apparent that the present invention is not limited to the above embodiments but may be changed and modified without departing from the scope and spirit of the invention. For example, the measured devices are not limited to the n-channel MOS transistors. In other words, the measured devices may be p-channel MOS transistors. Further, as long as the measured devices are MOSFETs, it is possible for the measured devices to assume the so-called MONOS geometries in addition to the MOS geometries. Further, it is also possible for the measured devices to assume the MOSFET geometries with lightly doped drains. Further, as for the dependency of the between gate/substrate capacitance (or, the between gate/well capacitance) $C_{GB}$ on the gate length, it is not limited only to the regression line defined by the equation:

$$C_{GB}=aL+b.$$

Further, in the above embodiments of the present invention, though the semiconductor substrate is grounded through the ammeter while both the drain and the source are grounded not passed through the ammeter, the gist of the present invention resides in that: any grounding is not necessarily required, provided that the semiconductor substrate is kept substantially at the same potential level as that of the source/drain diffusion layers to prevent a current flowing between the source and the drain from entering the ammeter which is used to measure a current flowing between the gate and the semiconductor substrate.

Further, in the above embodiments of the present invention, at first, only the DC bias voltage is applied to the gate so that the between gate/substrate resistance is calculated. Then, an AC voltage is also applied to the gate so that the between gate/substrate capacitance $C_{GB}$ is calculated. In place of the above, it is also possible to calculate the gate/substrate capacitance $C_{GB}$ on the basis of: a measured value of current (i.e., its effective value) flowing between the gate and the semiconductor substrate; and, a difference in phase between the above current thus measured and a measured voltage between the gate and the semiconductor substrate.

Further, in the above embodiments of the present invention, the gate length is obtained at each of the set points of the DC bias voltage when the gate/substrate capacitance $C_{GB}$ becomes a value of zero. Then, the saturated or the largest value of the thus obtained gate length is judged as the overlap length $\Delta L$. However, the present invention is not limited to the above. For example, when the fact that the saturated or the largest value of the gate length is obtained at a predetermined value of the DC bias voltage applied to the gate is known, it is possible to determine an exact value of the overlap length by simply deriving a single regression line in a condition in which the DC bias voltage is fixed to only the above predetermined value.

As described above, in the present invention having the above construction, the source and the drain of each of the measured devices are grounded not passed througth the ammeter, so that only the current flowing between the gate and the semiconductor substrate is measured. Consequently, it is possible for the present invention to remove both the overlap capacitance and the fringe capacitance (i.e., the so-called "short channel effect" and "two dimensional effect") which become remarkable when the channel length is decreased. Therefore, the present invention is capable of determining an exact value of the capacitance $C_{GB}$ of only the channel region. Due to this, the overlap length $\Delta L$ calculated on the basis of the above exact value of the capacitance $C_{GB}$ becomes also an exact value.

In the present invention, since the effective channel length Leff is calculated by the use of such exact value of the overlap length $\Delta L$, the effective channel length Leff thus obtained becomes also an exact value. Consequently, it is possible for the present invention to have its device model of the MOSFET simulate the actual device characteristics in more precise manner.

Finally, the present application claims the priority of Japanese Patent Application No. Hei10-213335 filed on Jul. 28, 1998, which is herein incorporated by reference.

What is claimed is:

1. A method for measuring an overlap length of each of a plurality of MISFETs varying in gate length (L), each of said MISFETs being formed in a surface region or in a well of said surface region of a semiconductor substrate, comprising the steps of:

applying a predetermined voltage to a gate of each of said MISFETs to keep each of said MISFETs turned OFF;

measuring a between gate/semiconductor substrate capacitance ($C_{GB}$) or a between gate/well capacitance ($C_{GB}$) in each of said gate lengths (L) of said MISFETs to obtain a capacitance measurement result;

finding out the dependency of said capacitance ($C_{GB}$) on each of said gate lengths (L) in each of said MISFETs on the basis of said capacitance measurement result; and determining an overlap length ($\Delta L$) on the basis of said dependency of said capacitance ($C_{GB}$) on each of said gate lengths (L), said gate overlapping both a source and said drain through said overlap length ($\Delta L$) in each of said MISFETS.

2. The method for measuring the overlap length of the MISFET, according to claim 1, wherein:

in a condition in which said semiconductor substrate or said well of each of said MISFETs is kept substantially at the same potential level as that of each of said source and said drain, or grounded together with said source and said drain, a predetermined DC or AC voltage is applied to a region between said gate and said semiconductor substrate or to a region between said gate and said well;

at lest, by the use of a current measuring means, a current flowing through said region between said gate and said semiconductor substrate, or through said region between said gate and said well is measured to obtain a current measurement result; and on the basis of said current measurement result, said capacitance ($C_{GB}$) between said gate and said semiconductor substrate, or, between said gate and said well is calculated on each of said gate lengths (L).

3. The method for measuring the overlap length of the MISFET, according to claim 2, wherein:

a voltage supply for applying a DC or an AC bias voltage to said gate is connected with said gate;

said current measuring means has one of its terminals connected with said semiconductor substrate or with said well;

a voltage measuring means has one of its terminals connected with said gate and the other of its terminals connected with said semiconductor substrate or with said well; and in a condition in which the other terminal of said current measuring means is set substantially at the same potential level as that of both said source and said drain, or, grounded together with said source and said drain, a voltage value between said gate and said semiconductor substrate or between said gate and said well is measured by said voltage measuring means;

by the use of said current measuring means, a value of current flowing between said gate and said semiconductor substrate or between said gate and said well is measured to obtain a voltage measurement result;

on the basis of said voltage measurement result, said capacitance ($C_{GB}$) between said gate and said semiconductor substrate, or, between said gate and said well is calculated on each of said gate lengths (L).

4. The method for measuring the overlap length of the MISFET, according to claim 2, wherein:

in a condition in which each of said MISFETs is held in its OFF mode, a predetermined value of DC bias voltage is applied to said gate, so that a resistance ($R_{GB}$) of an equivalent circuit disposed between said gate and said semiconductor substrate, or, between said gate and said well is determined;

also in said condition in which each of said MISFETs is held in its OFF mode, said predetermined value of DC bias voltage is applied to said gate together with an AC voltage having a predetermined frequency, so that an AC current flowing between said gate and said semiconductor substrate, or, between said gate and said well is determined;

on the basis of both said Ac current thus determined and said resistance ($R_{GB}$), said capacitance ($C_{GB}$) between said gate and said semiconductor substrate, or, between said gate and said well is calculated.

5. The method for measuring the overlap length of the MISFET, according to claim 2, wherein:

in a condition in which each of said MISFETs is held in its OFF mode, a predetermined value of DC bias voltage is applied to said gate together with an AC voltage having a predetermined frequency, so that both an effective value of an AC current flowing between said gate and said semiconductor substrate, or, between said gate and said well is determined together with a difference in phase between said AC current and an AC voltage appearing between said gate and said semiconductor substrate, or, between said gate and said well;

on the basis of both said effective value and said difference in phase thus determined, said capacitance ($C_{GB}$) between said gate and said semiconductor substrate, or, between said gate and said well is calculated.

6. The method for measuring the overlap length of the MISFET, according to claim 4, wherein:

a process of extrapolation is applied to the dependency of said capacitance ($C_{GB}$) on each of said gate lengths (L), so that a predetermined value ($L_0$) of said gate lengths (L) is determined; and said predetermined value ($L_0$) of said gate lengths (L) is judged to be said overlap length ($\Delta L$).

7. The method for measuring the overlap length of the MISFET, according to claim 2, wherein:

said capacitance ($C_{GB}$) between said gate and said semiconductor substrate, or, between said gate and said well on each of said gate lengths (L) is measured to derive a regression line defined by a predetermined equation ($C_{GB}=aL+b$) through which said capacitance ($C_{GB}$) is represented by a function of said gate lengths (L); and on the basis of said regression line thus derived, said predetermined value ($L_0$) of said gate lengths (L) is determined when said capacitance ($C_{GB}$) becomes a value of zero.

8. The method for measuring the overlap length of the MISFET, according to claim 6, wherein:

a plurality of DC bias voltages varying in value are sequentially applied to said gate of each of the MISFETs in a condition in which said AC voltage having said predetermined frequency is also applied to said gate, so that said capacitance ($C_{GB}$) between said gate and said semiconductor substrate, or, between said gate and said well on each of said gate lengths (L) is measured to obtain a capacitance measurement result;

on the basis of said capacitance measurement result, the dependency of said capacitance ($C_{GB}$) on each of said gate lengths (L) at each of said DC bias voltages applied to said gate is determined;

a process of extrapolation is applied to said dependency of said capacitance ($C_{GB}$) on each of said gate lengths (L) at each of said DC bias voltages, so that various values ($L_{01}, L_{02}, \ldots, L_{0n}$) of said gate lengths (L) are determined at each of said DC bias voltages; and the saturated or the largest one of said values ($L_{01}, L_{02}, \ldots, L_{0n}$) of said gate lengths (L) thus determined is judged to be said overlap length ($\Delta L$).

9. The method for measuring the overlap length of the MISFET, according to claim 7, wherein:

a plurality of DC bias voltages varying in value are sequentially applied to said gate of each of the MISFETs in a condition in which said AC voltage having said predetermined frequency is also applied to said gate, so that said capacitance ($C_{GB}$) between said gate and said semiconductor substrate, or, between said gate and said well on each of said gate lengths (L) is measured to obtain a capacitance measurement result;

on the basis of said capacitance measurement result, a regression line defined by a predetermined equation ($C_{GB}=aL+b$) through which said capacitance ($C_{GB}$) is represented by a function of said gate lengths (L) is derived;

on the basis of said regression line thus derived on each of said DC bias voltages, a plurality of values ($L_{01}, L_{02}, \ldots, L_{0n}$) of said gate lengths (L) are determined at each of said DC bias voltages when said capacitance ($C_{GB}$) becomes a value of zero; and the saturated or the largest one of said values ($L_{01}, L_{02}, \ldots, L_{0n}$) of said gate lengths (L) thus determined is judged to be said overlap length ($\Delta L$).

10. The method for measuring the overlap length of the MISFET, according to claim 4, wherein:

said voltage at which each of said MISFETs is held in its OFF mode is a value less than or in the vicinity of a threshold voltage at which a channel is formed in said semiconductor substrate or in said well each underneath said gate, whereby each of said MISFETs changes its mode from said OFF mode to its ON mode.

11. A device model of a MISFET defined by an equation representing a drain current flowing between a source and a drain of said MISFET when a DC bias voltage is applied to a gate of said MISFET, ssid drain current being represented by a function of parameters comprising:

a threshold value of said DC bias voltage, i.e., threshold voltage;

a resistance between said gate and a source of said MISFET;

an effective mobility of carriers depending on said gate voltage; and an effective channel length (Leff), wherein said effective channel length (Leff) is determined by subtracting an overlap length ($\Delta L$) from a gate length (L); and, said gate length (L) is determined by the use of a method for measuring said overlap length ($\Delta L$) of each of a plurality of said MISFETs varying in gate length (L), each of said MISFETs being formed in a surface region or in a well of said surface region of a semiconductor substrate, comprising the steps of:

applying a predetermined voltage to said gate of each of said MISFETs to keep each of said MISFETs turned OFF;

measuring a between gate/semiconductor substrate or a between gate/well capacitance ($C_{GB}$) in each of said gate lengths (L) of said MISFETs to obtain a capacitance measurement result;

finding out the dependency of said capacitance ($C_{GB}$) on each of said gate lengths (L) in each of said MISFETs on the basis of said capacitance measurement result; and determining an overlap length ($\Delta L$) on the basis of said dependency of said capacitance ($C_{GB}$) on each of said gate lengths (L), said gate overlapping both a source and said drain through said overlap length ($\Delta L$) in each of said MISFETs.

12. An apparatus for measuring an overlap length of each of a plurality of MISFETs varying in gate length, each of said MISFETs being formed in a surface region or in a well of said surface region of a semiconductor substrate of each of said MISFETs, wherein a plurality of DC bias voltages varying in value are sequentially applied to a gate of each of said MISFETs in a condition in which an AC voltage having a predetermined frequency is also applied to said gate, said apparatus comprising:

a capacitance input means for issuing a capacitance ($C_{GB}$) to a dependency-on-gate length derivation means, said capacitance ($C_{GB}$) being measured between said gate and said semiconductor substrate, or, between said gate and said well on each of said gate lengths (L) at each of a plurality of DC bias voltages;

said dependency-on-gate length derivation means which, on the basis of said capacitance ($C_{GB}$) issued from said capacitance input means, determines the dependency of said capacitance ($C_{GB}$) on said gate lengths (L); and an overlap length judging means for judging the saturated or the largest one of a plurality of values ($L_{01}$, $L_{02}$, ..., $L_{0n}$) of said gate lengths (L) to be an overlap length ($\Delta L$), said values ($L_{01}$, $L_{02}$, ..., $L_{0n}$) of said gate lengths (L) being determined by applying a process of extrapolation to said dependency of said capacitance ($C_{GB}$) on said gate lengths (L) at each of said DC bias voltages when said capacitance ($C_{GB}$) becomes a value of zero.

13. An apparatus for measuring an overlap length of each of a plurality of MISFETs varying in gate length, each of said MISFETs being formed in a surface region or in a well of said surface region of a semiconductor substrate of each of said MISFETS, wherein a plurality of DC bias voltages varying in value are sequentially applied to a gate of each of said MISFETs in a condition in which an AC voltage having a predetermined frequency is also applied to said gate, said apparatus comprising:

a capacitance input means for issuing a capacitance ($C_{GB}$) to a regression-line derivation means, said capacitance ($C_{GB}$) being measured between said gate and said semiconductor substrate, or, between said gate and said well on each of said gate lengths (L) at each of a plurality of DC bias voltages;

said regression-line derivation means which, on the basis of said capacitance ($C_{GB}$) issued from said capacitance input means, determines a regression line defined by a predetermined equation ($C_{GB}=aL+b$) through which said capacitance ($C_{GB}$) is represented by a function of said gate lengths (L), said regression line being determined at each of said DC bias voltages; and an overlap length judging means for judging the saturated or the largest one of a plurality of values ($L_{01}$, $L_{02}$, ..., $L_{0n}$) of said gate lengths (L) to be an overlap length ($\Delta L$), said values ($L_{01}$, $L_{02}$, ..., $L_{0n}$) of said gate lengths (L) being determined at each of by said DC bias voltages when said capacitance ($C_{GB}$) becomes a value of zero, on the basis of said regression line determined in said regression-line derivation means.

14. An apparatus for measuring an overlap length of each of a plurality of MISFETs varying in gate length, each of said MISFETs being formed in a surface region or in a well of said surface region of a semiconductor substrate of each of said MISFETs, wherein a plurality of DC bias voltages varying in value are sequentially applied to a gate of each of said MISFETs in a condition in which an AC voltage having a predetermined frequency is also applied to said gate, said apparatus comprising:

a capacitance measuring means for measuring a capacitance ($C_{GB}$) between said gate and said semiconductor substrate, or, between said gate and said well on each of said gate lengths (L) when both said DC bias and said AC voltage are applied to said gate, said capacitance measuring means being provided with both an AC and a DC voltage supply to issue a measurement result;

a dependency-on-gate length derivation means which, on the basis of said measurement result issued from said capacitance measuring means, determines the dependency of said capacitance ($C_{GB}$) on said gate lengths (L) at each of said DC bias voltages; and an overlap length judging means for judging the saturated or the largest one of a plurality of values ($L_{01}$, $L_{02}$, ..., $L_{0n}$) of said gate lengths (L) to be an overlap length ($\Delta L$), said values ($L_{01}$, $L_{02}$, ..., $L_{0n}$) of said gate lengths (L) being determined by applying a process of extrapolation to said dependency of said capacitance ($C_{GB}$) on said gate lengths (L) at each of said DC bias voltages when said capacitance ($C_{GB}$) becomes a value of zero.

15. An apparatus for measuring an overlap length of each of a plurality of MISFETs varying in gate length, each of said MISFETs being formed in a surface region or in a well of said surface region of a semiconductor substrate of each of said MISFETs, wherein a plurality of DC bias voltages varying in value are sequentially applied to a gate of each of said MISFETs in a condition in which an AC voltage having a predetermined frequency is also applied to said gate, said apparatus comprising:

a capacitance measuring means for measuring a capacitance ($C_{GB}$) between said gate and said semiconductor substrate, or, between said gate and said well on each of said gate lengths (L) when both said DC bias and said AC voltage are applied to said gate, said capacitance measuring means being provided with both an AC and a DC voltage supply to issue a measurement result;

a regression-line derivation means which, on the basis of said measurement result issued from said capacitance measuring means, determines a regression line defined by a predetermined equation ($C_{GB}=aL+b$) through which said capacitance ($C_{GB}$) is represented by a function of said gate lengths (L), said regression line being determined at each of said DC bias voltages; and an overlap length judging means for judging the saturated or the largest one of a plurality of values ($L_{01}$, $L_{02}$, ..., $L_{0n}$) of said gate lengths (L) to be an overlap length ($\Delta L$), said values ($L_{01}$, $L_{02}$, ..., $L_{0n}$) of said gate lengths (L) being determined at each of said DC bias voltages when said capacitance ($C_{GB}$) becomes a value of zero, on the basis of said regression line determined in said regression-line derivation means.

16. A recording medium accessible through a computer, wherein each of a plurality of MISFETs varying in gate length (L) is formed in a surface region or in a well of said surface region of a semiconductor substrate of each of said MISFETs, wherein a plurality of DC bias voltages varying in value are sequentially applied to a gate of each of said MISFETs in a condition in which an AC voltage having a predetermined frequency is also applied to said gate, said recording medium storing therein an overlap-length calculating program for calcurating an overlap length of each of said MISFETs, said program being executed by said computer and comprising the steps of:

determining the dependency of a capacitance ($C_{GB}$) on each of said gate lengths (L) at each of said DC bias voltages on the basis of said capacitance ($C_{GB}$) which is supplied from a data input means, said capacitance ($C_{GB}$) appearing between said gate and said semiconductor substrate, or, between said gate and said well on each of said gate lengths (L) at each of a plurality of DC bias voltages;

calculating each of a plurality of values ($L_{01}$, $L_{02}$, ..., $L_{0n}$) of said gate lengths (L) by applying a process of extrapolation to the dependency of said capacitance ($C_{GB}$) on said gate lengths (L) at each of said DC bias voltages when said capacitance ($C_{GB}$) becomes a value of zero; and judging the saturated or the largest one of said values ($L_{01}$, $L_{02}$, ..., $L_{0n}$) of said gate lengths (L) to be an overlap length ($\Delta L$).

17. A recording medium accessible through a computer, wherein each of a plurality of MISFETs varying in gate length (L) is formed in a surface region or in a well of said surface region of a semiconductor substrate of each of said MISFETs, wherein a plurality of DC bias voltages varying in value are sequentially applied to a gate of each of said MISFETs in a condition in which an AC voltage having a predetermined frequency is also applied to said gate, said recording medium storing therein an overlap-length calculating program for calcurating an overlap length of each of said MISFETs, said program being executed by said computer and comprising the steps of:

determining a regression line defined by a predetermined equation ($C_{GB}=aL+b$) through which said capacitance ($C_{GB}$) is represented by a function of said gate lengths (L), said regression line being determined at each of said DC bias voltages on the basis of said capacitance ($C_{GB}$) when said capacitance ($C_{GB}$) is supplied from a data input means, said capacitance ($C_{GB}$) appearing between said gate and said semiconductor substrate, or, between said gate and said well on each of said gate lengths (L) at each of said DC bias voltages;

calculating a plurality of values ($L_{01}$, $L_{02}$, ..., $L_{0n}$) of said gate lengths (L) on the basis of said regression line at each of said DC bias voltages when said capacitance ($C_{GB}$) becomes a value of zero; and judging the saturated or the largest one of said values ($L_{01}$, $L_{02}$, ..., $L_{0n}$) of said gate lengths (L) to be an overlap length ($\Delta L$).

18. The recording medium accessible through the computer, according to claim 17, wherein each of a plurality of MISFETs varying in gate length (L) is formed in a surface region or in a well of said surface region of a semiconductor substrate of each of said MISFETs, wherein a plurality of DC bias voltages varying in value are sequentially applied to a gate of each of said MISFETs in a condition in which an AC voltage having a predetermined frequency is also applied to said gate, said recording medium storing therein an overlap-length calculating program for calcurating an overlap length of each of said MISFETs, said program being executed by said computer, said program further comprising the step of:

calculating said capacitance ($C_{GB}$) between said gate and said semiconductor substrate, or, between said gate and said well on each of said gate lengths (L) at each of said DC bias voltages, on the basis of a current and a voltage both supplied from data input means, said current and said voltage appearing between said gate and said semiconductor substrate, or, between said gate and said well of each of said MISFETs.

* * * * *